(12) United States Patent
Liu et al.

(10) Patent No.: US 8,204,730 B2
(45) Date of Patent: Jun. 19, 2012

(54) GENERATING VARIATION-AWARE LIBRARY DATA WITH EFFICIENT DEVICE MISMATCH CHARACTERIZATION

(75) Inventors: Jinfeng Liu, Cupertino, CA (US); Feroze P. Taraporevala, Los Altos, CA (US)

(73) Assignee: Synopsys, Inc., Mountain View, CA (US)

(*) Notice: Subject to any disclaimer, the term of this patent is extended or adjusted under 35 U.S.C. 154(b) by 1048 days.

(21) Appl. No.: 12/135,033

(22) Filed: Jun. 6, 2008

(65) Prior Publication Data

US 2009/0306953 A1 Dec. 10, 2009

(51) Int. Cl.
*G06G 7/62* (2006.01)
(52) U.S. Cl. ......................................... 703/13
(58) Field of Classification Search .................. 703/13
See application file for complete search history.

(56) References Cited

U.S. PATENT DOCUMENTS

2009/0031268 A1* 1/2009 Miranda et al. .................. 716/6

OTHER PUBLICATIONS

Shubhankar Basu et al., "Process variation tolerant standard cell library development using reduced dimension statistical modeling and optimization techniques", 2007, Proceedings of the 8th International Symposium on Quality Electronic Design, seven unnumbered pages.*
Ali Dasdan et al., "designing and validating process-variation-aware cell libraries", 2007, Proceedings of the 8th International Symposium on Quality Electronic Design, seven unnumbered pages.*
David Blaauw et al., "Statistical timing analysis: from basic principles to state of the art", Apr. 2008, IEEE Transactions on computer-aided design of integrated circuits and systems, vol. 27, No. 4, pp. 589-607.*
Savithri Sundareswaran et al., "Characterization of standard cells for intra-cell mismatch variations", Mar. 17, 2008, 9th International Symposium on Quality Electronic Design, pp. 213-219.*
Ratnakar Goyal et al., "Improved first-order parameterized statistical timing analysis for handling slew and capacitance variation", 2007, 20th International Conference on VLSI Design, five unnumbered pages.*
J. Oehm et al., "Quality assurance and upgrade of analog characteristics by fast mismatch analysis option in network analysis environment", 1993, IEEE Journal of Solid-State Circuits, vol. 28, No. 7, pp. 865-871.*
Guerra e Silva et al., "Variation-aware, Library compatible delay modeling strategy", Oct. 16, 2006, 2006 IFIP International Conference on Very Large Scale Integration, pp. 122-127.*
K. Agarwal et al., "Variational delay metrics for interconnect timing analysis", 2004, Proceedings of the 2004 41st Design Automation Conference, pp. 381-384.*

(Continued)

*Primary Examiner* — Kandasamy Thangavelu
*Assistant Examiner* — Russ Guill
(74) *Attorney, Agent, or Firm* — Bever, Hoffman & Harms, LLP; Jeanette S. Harms

(57) ABSTRACT

In a method of generating variation-aware library data for statistical static timing analysis (SSTA), a "synthetic" Gaussian variable can be used to represent all instances of one or more mismatch variations in all devices (e.g. transistors), thereby capturing the effect on at least one timing property (e.g. delay or slew). By modeling device mismatch with synthetic random variables, the variation behavior (in terms of the distribution of delay, slew, constraint, etc.) can be interpreted as the outcomes of process variations instead of modeling the variation sources (e.g. transistor shape variations, variations in dopant atom density, and irregularity of edges).

36 Claims, 22 Drawing Sheets

OTHER PUBLICATIONS

C. Forzan et al., "Why we need statistical static timing analysis", Oct. 7, 2007, 25th International Conference on Computer Design, pp. 91-96.*

Hongliang Chang et al., "Parameterized block-based statistical timing analysis with non-gaussian paraameters, nonlinear delay functions", 2005, 2005 Design Automation Conference, pp. 71-76.*

Okada et al.: "A Statistical Gate-Delay Model Considering Intra-Gate Variability", ICCAD '03, Nov. 11-13, 2003, San Jose, CA, USA, Copyright 2003 ACM 1-58113-762-1/03/0011.

Singhee et al.: "Beyond Low-Order Statistical Response Surfaces: Latent Variable Regression for Efficient, Highly Nonlinear Fitting", DAC 2007, Jun. 4-8, 2007, San Diego, CA, USA, Copyright 2007 ACM 978-1-59593-627-1/07/0006.

Kim et al.: "Fast, Non-Monte-Carlo Estimation of Transient Performance Variation Due to Device Mismatch", DAC 2007, Jun. 4-8, 2007, San Diego, CA, USA, Copyright 2007 ACM 978-1-59591-627-1/07/0006.

* cited by examiner

800

900

```
... instantiate cell and setup initial condition
...
.TRAN ... SWEEP DATA=stimdata
...
.DATA stimdata
slew cap ... other parameters ...
... slew_1 cap_1 ...
... slew_2 cap_2 ...
...
... slew_P cap_P ...
.ENDDATA
...
... measure NLDM/CCS data
...
.END
                                              1400
```

Figure 14

```
... instantiate cell and setup initial condition
...
.MODEL optmod OPT METHOD = PASSFAIL ...
.TRAN ... SWEEP ... MODEL=optmod ...
...
... measure NLDM data
...
.DATA stimdata
slew_clk slew_d ... other parameters ...
... slew_clk_1 slew_d_1 ...
.ENDDATA .ALTER Alter Index = 2 [setup]
.DATA stimdata
slew_clk slew_d ... other parameters ...
... slew_clk_2 slew_d_2 ...
.ENDDATA .ALTER Alter Index = 3 [setup]
...

.ALTER Alter Index = P [setup]
.DATA stimdata
slew_clk slew_d ... other parameters ...
... slew_clk_P slew_d_P ...
.ENDDATA
                                              1500
.END
```

Figure 15

```
.TRAN ... SWEEP DATA=stimdata
...
.DATA stimdata
slew cap ... other parameters ...
... slew_1 cap_1 ...
... slew_2 cap_2 ...
...
... slew_P cap_P ...
.ENDDATA
... measurements
.END
                                          1600
```

Figure 16A

```
                                          1601
.TRAN ... SWEEP MONTE=K
...
.PARAM
+ slew=slew_1 cap=cap_1 ...
... measurements
.END
```

```
                                          1602
...
.TRAN ... SWEEP MONTE=K
...
.PARAM
+ slew=slew_P cap=cap_P ...
... measurements
.END
```

```
.TRAN ... SWEEP DATA=stimdata
...
.DATA stimdata
slew cap ... other parameters ...
... slew_1 cap_1 ...
... slew_2 cap_2 ...
...
... slew_P cap_P ...
.ENDDATA
... measurements
.END
                                    1700
```

Figure 17A

```
...
.TRAN ... SWEEP DATA=extstim
...
.DATA extstim
par1 par2 ... parN
... sample set 1
...
... sample set K           1701
.ENDDATA
.PARAM
+ slew=slew_1 cap=cap_1 ...
... measurements
.END
```

Figure 17B

```
.TRAN ... SWEEP DATA=extstim
...
.DATA extstim
par1 par2 ... parN
... sample set 1
...
... sample set K           1702
.ENDDATA
.PARAM
+ slew=slew_P cap=cap_P ...
... measurements
.END
```

Figure 17C

```
.MODEL optmod OPT METHOD = PASSFAIL ...
.TRAN ... SWEEP ... MODEL=optmod ...
... measures
.DATA stimdata
slew_clk slew_d ...                        1800
... slew_clk_1 slew_d_1 ...
.ENDDATA
.ALTER Alter Index = 2 [setup]
.DATA stimdata
slew_clk slew_d ...
... slew_clk_2 slew_d_2 ...
.ENDDATA
...
.ALTER Alter Index = P [setup]
.DATA stimdata
slew_clk slew_d ...
... slew_clk_P slew_d_P ...
.ENDDATA
```

Figure 18A

```
.MODEL optmod OPT METHOD = PASSFAIL ...
.TRAN ... SWEEP ... MODEL=optmod ...
... measures
.DATA stimdata
slew_clk slew_d ...
... slew_clk_1 slew_d_1 ...
.ENDDATA
.PARAM
+ par1=... par2=... ... parN=...
.ALTER MC Index = 2
.PARAM
+ par1=... par2=... ... parN=...
...
.ALTER MC Index = K
+ par1=... par2=... ... parN=...
.ENDDATA
.END                                 1801
```

Figure 18B

```
.MODEL optmod OPT METHOD = PASSFAIL ...
.TRAN ... SWEEP ... MODEL=optmod ...
... measures
.DATA stimdata
slew_clk slew_d ...
... slew_clk_P slew_d_P ...
.ENDDATA
.PARAM
+ par1=... par2=... ... parN=...
.ALTER MC Index = 2
.PARAM
+ par1=... par2=... ... parN=...
...
.ALTER MC Index = K
+ par1=... par2=... ... parN=...
.ENDDATA
.END                                 1802
```

Figure 18C

```
...
.TRAN ... SWEEP DATA=stimdata
...
.DATA stimdata
slew cap ... other parameters ...
... slew_1 cap_1 ...
... slew_2 cap_2 ...
...
... slew_P cap_P ...
.ENDDATA
... measurements
.END                                    1900
```

Figure 19A

```
...
.TRAN ... SWEEP DATA=extstim
...
.DATA extstim
par1 par2 ... parN
1 0 ... 0
0 1 ... 0                               1901
...
0 0 ... 1
.ENDDATA
.PARAM
+ slew=slew_1 cap=cap_1 ...
... measurements
.END
```

Figure 19B

```
...
.TRAN ... SWEEP DATA=extstim
...
.DATA extstim
par1 par2 ... parN
1 0 ... 0
0 1 ... 0
...                                     1902
0 0 ... 1
.ENDDATA
.PARAM
+ slew=slew_P cap=cap_P ...
... measurements
.END
```

Figure 19C

```
.MODEL optmod OPT METHOD = PASSFAIL ...
.TRAN ... SWEEP ... MODEL=optmod ...
... measures
.DATA stimdata
slew_clk slew_d ...
... slew_clk_1 slew_d_1 ...
.ENDDATA
.ALTER Alter Index = 2 [setup]
.DATA stimdata
slew_clk slew_d ...
... slew_clk_2 slew_d_2 ...
.ENDDATA
...
.ALTER Alter Index = P [setup]
.DATA stimdata
slew_clk slew_d ...
... slew_clk_P slew_d_P ...        2000
.ENDDATA
```

Figure 20A

```
.MODEL optmod OPT METHOD = PASSFAIL ...
.TRAN ... SWEEP ... MODEL=optmod ...
... measures
.DATA stimdata
slew_clk slew_d ...
... slew_clk_1 slew_d_1 ...
.ENDDATA                            2001
.PARAM
+ par1=1 par2=0 ... parN=0
.ALTER Sensitivity Index = 2
.PARAM
+ par1=0 par2=1 ... parN=0
...
.ALTER Sensitivity Index = N
+ par1=0 par2=0 ... parN=1
.ENDDATA
.END
```

Figure 20B

```
.MODEL optmod OPT METHOD = PASSFAIL ...
.TRAN ... SWEEP ... MODEL=optmod ...
... measures
.DATA stimdata
slew_clk slew_d ...
... slew_clk_P slew_d_P ...
.ENDDATA                            2002
.PARAM
+ par1=1 par2=0 ... parN=0
.ALTER Sensitivity Index = 2
.PARAM
+ par1=0 par2=1 ... parN=0
...
.ALTER Sensitivity Index = N
+ par1=0 par2=0 ... parN=1
.ENDDATA
.END
```

Figure 20C

GENERATING VARIATION-AWARE LIBRARY DATA WITH EFFICIENT DEVICE MISMATCH CHARACTERIZATION

BACKGROUND OF THE INVENTION

1. Field of the Invention

The present invention relates to libraries for determining integrated circuit performance and in particular to generating libraries with efficient device mismatch characterization.

2. Discussion of the Related Art

Within-cell variation, or device (e.g. transistor) mismatch variation, refers to process variations that are applied to each individual device within a cell (e.g. standard or macro). Gate level statistical timing tools cannot handle device mismatch variation with full accuracy that requires each device to vary independently. Specifically, the characterization flow becomes very complicated because multiple variation parameters are required per device, thereby making the size of library data unmanageable and commercially unviable.

For better characterization, one current modeling technique treats all device mismatch variations as fully correlated within a cell, but not correlated across cells. The transistor mismatch variations are known to be random (i.e. not correlated) within each cell as well as across different cells. As a result, the transistor-level behavior can be modeled at the cell level to reduce the modeling complexity although introducing some inaccuracy and pessimism (i.e. uncertainty of accuracy) at the cell level. The cancellation effect across cells can mitigate the deviation of this model from the true mismatch model in which cancellation takes place both within-cell and across-cell. As can be expected, this transistor-mismatch solution is most accurate when few transistors are included in the cell arc. Experimental data shows good accuracy for timing paths with 10 cells or more. However, the pessimism is non-trivial in short paths especially with large cells that have many transistors per cell arc.

Therefore, what is needed is an accurate model for random within-cell effects (i.e. effects that occur independently of one another), thereby allowing the generation of variation-aware libraries usable during statistical static timing analysis (SSTA).

SUMMARY OF THE INVENTION

In accordance with one aspect of generating variation-aware library data for statistical static timing analysis (SSTA), a "synthetic" Gaussian variable can be used to represent all instances of one or more mismatch variations in all devices (e.g. transistors), thereby capturing the effect on at least one timing property (e.g. delay or slew). As used herein, the term "synthetic" refers to a variable that is derived from a plurality of device data and therefore does not necessarily represent the characteristics of any one device. By modeling device mismatch with synthetic random variables, the variation behavior (in terms of the distribution of delay, slew, constraint, etc.) can be interpreted as the outcomes of process variations instead of modeling the variation sources (e.g. transistor shape variations, variations in dopant atom density, and irregularity of edges).

A method of generating variation-aware library data can include receiving a circuit simulation (e.g. HSPICE) model on at least one device mismatch parameter. A sensitivity analysis can then be performed on all device mismatch parameters. Notably, a distribution of a timing property can be derived using the sensitivity analysis. A mapping of one or more synthetic parameters to the distribution can be determined. After selecting an assignment of device mismatch parameter values, a deterministic circuit simulation can be performed using the assignment of device mismatch parameter values to generate the variation-aware library data corresponding to the 1 sigma point of the synthetic parameter.

In one embodiment, performing the sensitivity analysis can include computing a rate of change of the timing property compared to a rate of change of a device mismatch parameter. The sensitivity values generated by the sensitivity analysis can be expressed in either linear or non-linear terms.

Deriving the distribution of a timing property using the sensitivity analysis can include performing a Monte Carlo sampling for all device mismatch parameters, and then computing each sample value of the distribution by performing a linear sum of a product of each sample value of $Vi_j$ and $Si_j$, wherein $Vi_j$ is a specific device parameter and $Si_j$ is the sensitivity value of the specific device parameter. Deriving the distribution of the timing property using the sensitivity analysis can also include computing the 1 sigma from the distribution. When all device mismatch parameter are independent Gaussians with linear timing responses, computing the 1 sigma can include squaring each sensitivity, summing the squared sensitivities, and taking a square root of the sum.

In one embodiment, performing the sensitivity analysis includes characterizing only active devices. For example, a predetermined number of points (e.g. 3-7) in a two-dimensional library table space can be evaluated to determine the active devices. In another embodiment, performing the sensitivity analysis can include reducing the library table points for sensitivity extraction based on nominal timing responses or using predetermined library table points.

In yet another embodiment, performing the sensitivity analysis can include running full sensitivity extraction at a first point in a two-dimensional library table space (e.g. based on input slew/output load or clock slew/data slew) to determine dominant parameters. At this point, sensitivity values for most dominant parameters can be extracted at a second point in the two-dimensional library table space. Additionally, sensitivity values for selected, less-dominant parameters can also be extracted at the second point. Notably, sensitivity values for any remaining, less-dominant parameters can be interpolated at the second point using the sensitivity values for the selected, less-dominant parameters at the second point and the full sensitivity extraction at the first point.

In one embodiment, determining a mapping of a synthetic parameter to the distribution includes replacing arbitrary quantile values that correspond to the synthetic parameter when the distribution is not Gaussian. In another embodiment, note that multiple synthetic parameters can be determined by at least one of an arbitrary grouping of device mismatch parameters, and performing principle component analysis to distributions of timing attributes.

BRIEF DESCRIPTION OF THE FIGURES

FIG. 14 illustrates delay arc characterizations for an HSPICE deck.

FIG. 15 illustrates constraint arc characterizations for an HSPICE deck.

FIGS. 16A, 16B, and 16C illustrate exemplary decks for a conversion of a regular delay characterization deck into P Monte Carlo decks for each library data point.

FIGS. 17A, 17B, and 17C illustrate how an original delay characterization deck can be first split into P new decks without data sweep.

FIGS. 18A, 18B, and 18C illustrate how an original constraint characterization deck can be split into P new decks.

FIGS. 19A, 19B, 19C, 20A, 20B, and 20C illustrate an exemplary sensitivity extraction flow for N parameters.

DETAILED DESCRIPTION OF THE FIGURES

Device mismatch refers to the process variations that apply to individual devices within a cell. A class of these variations is known to be random. As a result, the delay and slew for each arc (i.e. a data path between an input and an output of the cell) exhibit some variability introduced by device-level process variation in addition to the global variation effect. Note that although transistor mismatch is described in detail below, other types of device mismatch may be present. Therefore, as used herein, the term device mismatch can refer to transistor mismatch or any other type of mismatch present in an integrated circuit implementing digital logic.

Figure 1:
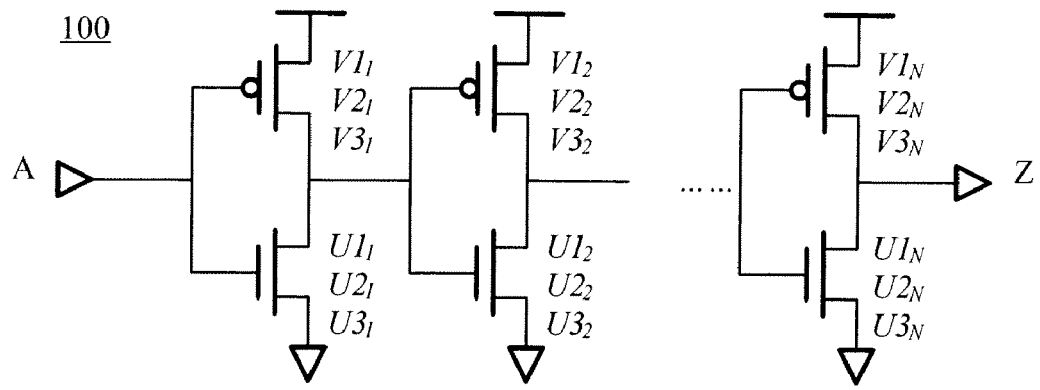
FIG. 1 illustrates an exemplary cell that includes multiple parameters that can vary within a cell, thereby leading to device (e.g. transistor) mismatch variation.

FIG. 1 shows an example of a cell 100 with n p-n transistor pairs. In cell 100, each transistor has three parameters representing process variation at transistor-level, i.e. V1, V2, and V3 denoting parameters on the p-transistors and U1, U2, and U3 denoting parameters on the n-transistors. Note that each parameter can affect the $j^{th}$ transistor independently by a random variable $Vi_j$ or $Ui_j$. Thus, a delay D of the arc from "A" to "Z" is a random variable as a function of all $Vi_j$ and $Ui_j$. As a result, there are 6n independent variation parameters at the transistor level. Exemplary transistor mismatch parameters can include, but are not limited to, threshold voltage or gate length.

Table 1 summarizes the transistor mismatch models from two hypothetical foundries. Foundry 1 models three parameters per transistor, whereas Foundry 2 models two parameters per transistor.

TABLE 1

Transistor mismatch models from two foundries

|  | Foundry 1 | Foundry 2 |
| --- | --- | --- |
| mismatch parameters for n-transistor | n_Vt<br>n_beta1<br>n_beta2 | n_L<br>n_Vt |
| mismatch parameters for p-transistor | p_Vt<br>p_beta1<br>p_beta2 | p_L<br>p_Vt |

Unfortunately, current static timing analysis (STA) tools are not transistor-level, i.e. they cannot directly model the variation behavior at each transistor. These tools could correctly model transistor-mismatch behavior if each transistor-level parameter $Vi_j$ or $Ui_j$ could be transferred to a cell-level parameter. However, such modeling would require separate library data for each $Vi_j$ or $Ui_j$, thereby resulting in many libraries with potentially different numbers of libraries per cell. Therefore, it is not practical to model each transistor's mismatch parameter in current STA tools.

Figure 2:
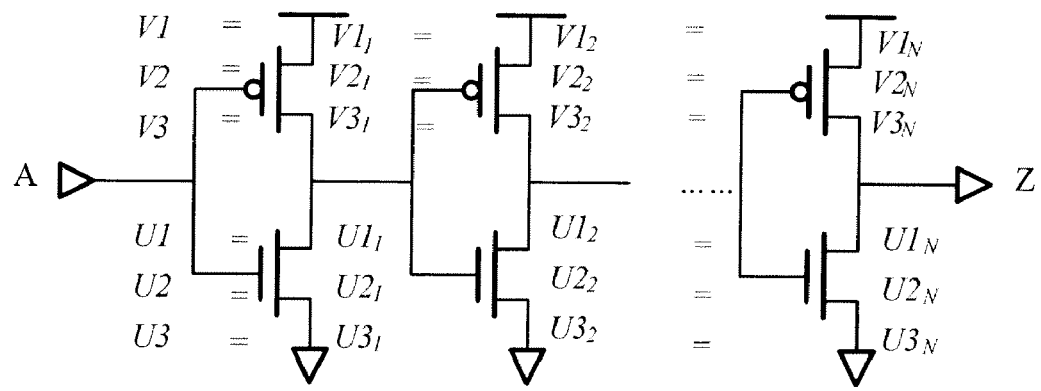
FIG. 2 illustrates the arc of FIG. 1 in which modeling treats transistor mismatch as fully correlated within the cell.

One solution is to model each mismatch parameter as fully correlated across all transistors in a cell as shown in FIG. 2. This straightforward approach reduces each parameter's independent instances on each transistor as a cell-level parameter, i.e. the same value Vi can be assigned to all instances of $Vi_1$, $Vi_2$, ..., $Vi_n$ (i.e. $V1=V1_1=V1_2 \ldots =V1_n$, $U1=U1_1=U1_2 \ldots =U1_n$ etc.). As a result, 6 libraries are needed to model transistor mismatch instead of 6n libraries. Thus, the delay of the arc from A to Z is a function of V1, V2, V3, U1, U2, and U3.

Unfortunately, by modeling all transistors in a cell as fully correlated on each parameter, the variance of arc delay is magnified at the cell-level, thereby resulting in some pessimism for each cell arc. The mismatch parameters across different cells are not correlated. For a given path consisting of multiple cells, the pessimism existing in each cell can be cancelled out across stages. As a result the pessimism in the overall path arrival can be reduced as the path has more stages, as shown in empirical data in FIGS. 3A and 3B. FIG.

Figure 3A:
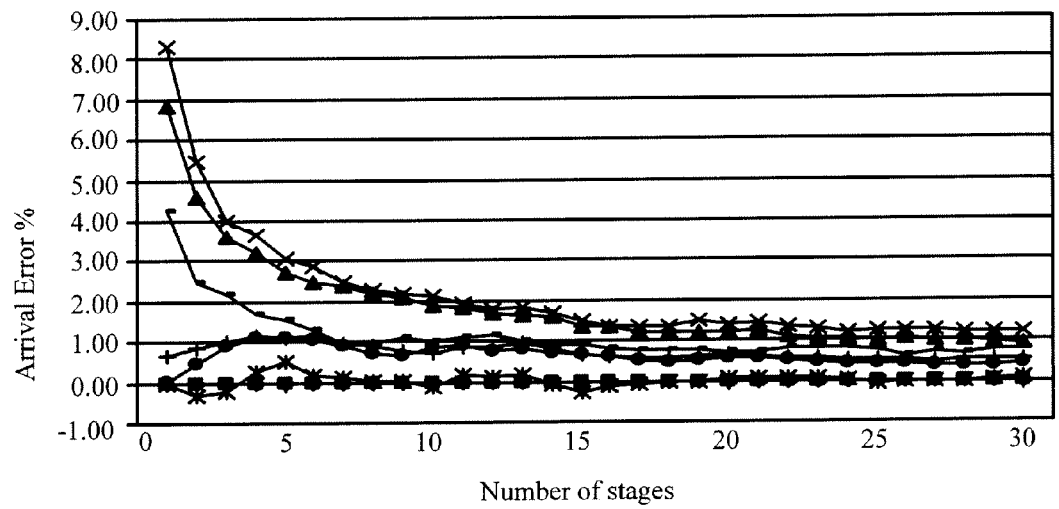
FIGS. 3A and 3B illustrate that when all transistors in a cell are fully correlated on each parameter, the stage arrival error is typically reduced as the path has more stages.
Figure 3B:
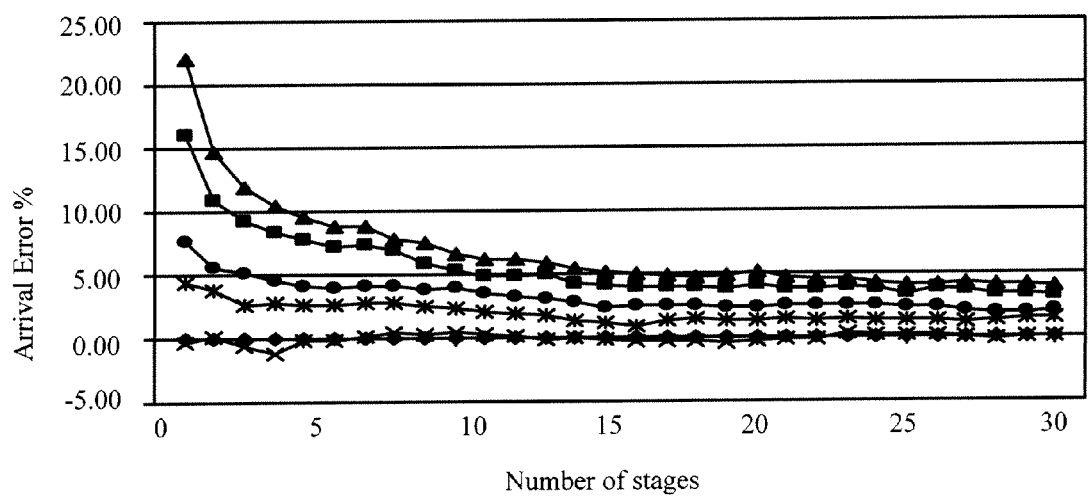

3A compares the arrival error (%) with the number of stages for a plurality of models from a first foundry. FIG. 3B compares the stage arrival error (%) with the number of stages for a plurality of models from a second foundry. In FIGS. 3A and 3B, the curves represent the difference of 3-sigma arrival time along a 30-stage path consisting of buffer and inverter cells of different sizes. Note that the error is non-trivial in the first 5 stages. However, the error then decreases gradually as the number of stage increases. Larger cells also tend to involve more pessimism in early stages because all transistors are forced to behave in the same way. Note that each curve in FIGS. 3A and 3B shows the behavior of a data path with 30 buffer and inverter cells (hence, the horizontal axis of 30 stages), wherein cells from different paths have different strengths (and a different number of transistors implementing each cell).

The drawback of the current STA model in which all transistors in a cell are fully correlated on each parameter lies in the pessimism introduced at the cell-level that would impact short paths. The amount of pessimism varies on different cell sizes and cannot be tightly bounded for large cells.

Notably, the assumption that all transistors within a cell are fully correlated on a given mismatch parameter can be revised based on a non-intuitive observation. Specifically, when a parameter Vi varies independently on all cells, the impact on arc delay approximately resembles a Gaussian distribution. As a result, the combined delay effect of a mismatch parameter Vi on all transistors $Vi_1, Vi_2, \ldots Vi_R$ can be estimated as a synthetic variable Mi, i.e. a Gaussian variable $N(\mu, \sigma(D_{Mi}))$, where $\mu$ is the nominal value of the arc delay and $\sigma(D_{Mi})$ is the standard deviation of delay from the mismatch effect of Vi on all transistors.

Figure 4:
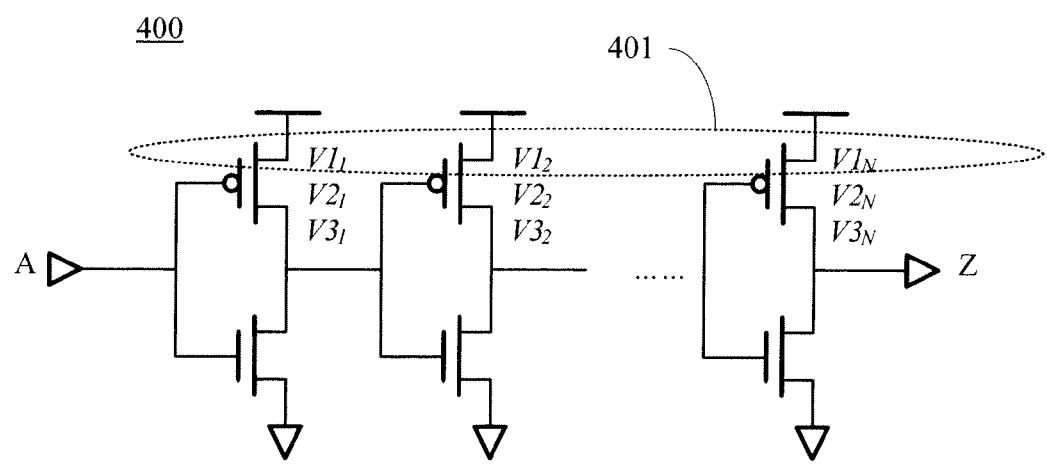
FIG. 4 illustrates a cell in which all V1s can be combined into a single variable M1. Therefore, a delay $D_{M1}$ can be characterized as a function of M1.

For example, consider the cell 400 of FIG. 4 in which the V1 parameters 401 are not forced to be fully correlated, but instead are combined into a synthetic variable M1 that allows each V1 to be independent. Assume a synthetic random variable Mi (in FIG. 4, i=1, 2, or 3) that contributes to a delay distribution $D_{Mi}$. Mi combines all the effect of one mismatch parameter Vi on all transistors within a cell, and Mi is a standard Gaussian N(0,1). When Mi takes a sample value at the normalized standard deviation 1, the value of the delay distribution $D_{Mi}$ will be at $\mu+\sigma(D_{Mi})$ Likewise, when Mi=−1, $D_{Mi}=\mu-\sigma(D_{Mi})$. Also when Mi=0, $D_{Mi}=\mu$ that equals to the nominal delay.

Figure 5:
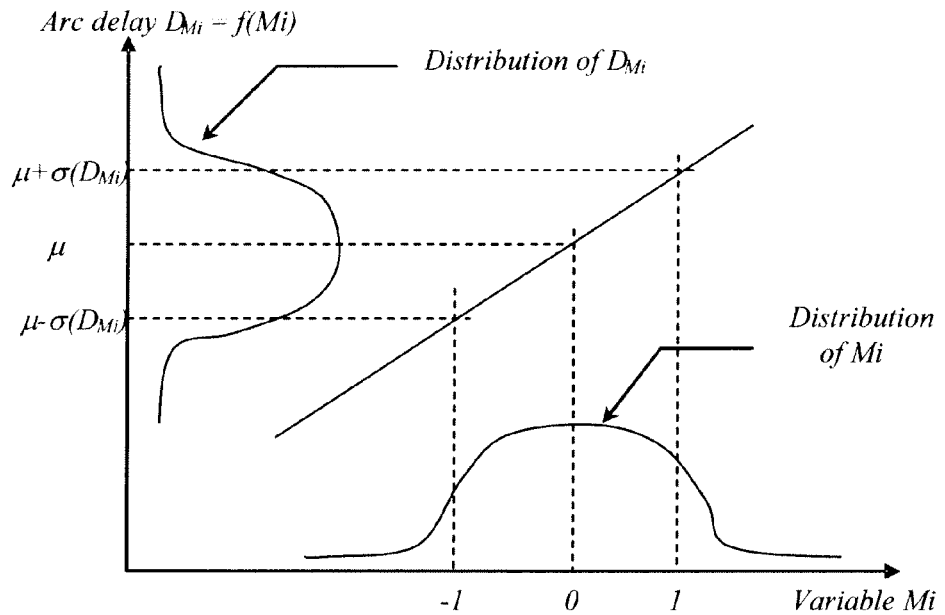
FIG. 5 illustrates the mapping between the synthetic variable Mi and the delay distribution $D_{Mi}$.

The mapping between the synthetic variable Mi and the delay distribution $D_{Mi}$ is illustrated in FIG. 5. Notably, as shown below, mismatch variations can be modeled in a similar way as global variations. In accordance with FIG. 5, two libraries can be used to represent the variation from transistor mismatch by setting variable Mi at −1 and +1. In one embodiment, the −1 library data is not necessary because $D_{Mi}$ is a linear transformation of Mi (i.e., $D_{Mi}=\mu+\sigma(D_{Mi})\times Mi$, assuming that $D_{Mi}$ follows a Gaussian distribution).

Figure 6:
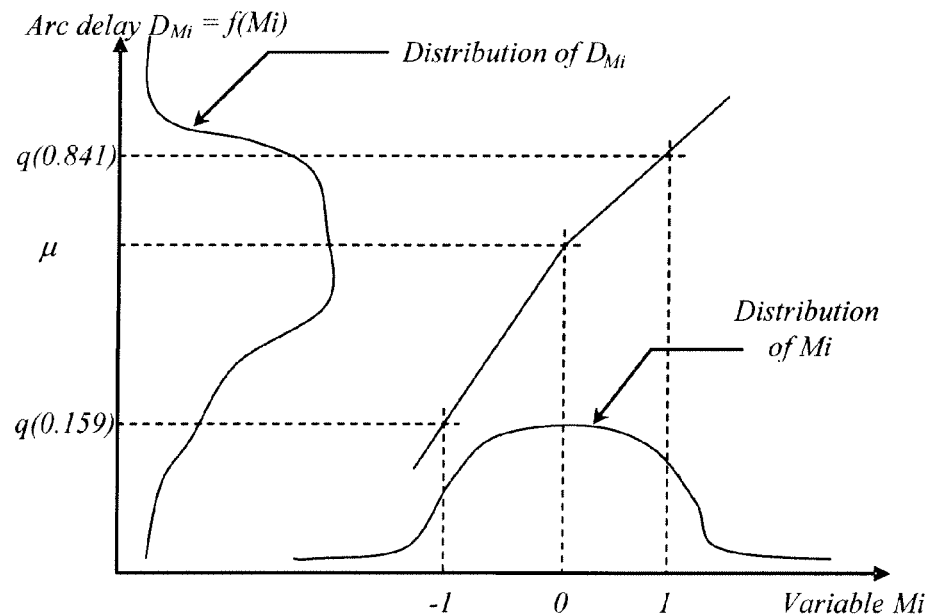
FIG. 6 illustrates that $D_{Mi}$ can exhibit non-Gaussian behaviors while still being characterizable as a function of the synthetic variable Mi.

If $D_{Mi}$ cannot be closely resembled by a Gaussian, e.g. it is showing some skewness or asymmetry, $\mu\pm\sigma(D_{Mi})$ can be replaced with some arbitrary quantile values that correspond to ±1 sigma (or other arbitrary values) of variable Mi. For example, $D_{Mi}$ of FIG. 6 exhibits non-Gaussian behaviors while still being characterizable as a (non-linear or PWL) function of variable Mi. In this example, quantile values of 0.841 and 0.159 correspond to ±1 sigma values of a standard Gaussian distribution. Note that in other embodiments any arbitrary quantile values (e.g. 0.99865/0.00135 for ±3 sigma) of Mi can be taken to improve modeling accuracy. If necessary, extra points can be added as well if the STA tool supports more than two libraries per variation parameter.

Notably, this approach does not need any code change in the STA tool or any library format change. However, as described below, this approach may include running full Monte Carlo simulation on each mismatch parameter, and then computing the $\sigma(D_{Mi})$ point or specific quantile points to be stored in the libraries. A Monte Carlo simulation (also called an analysis herein) attempts to estimate an output by performing random (but complete) samplings of the inputs. For example, if there are 20 transistors in an arc and each transistor has three types of variation, then there are 20×3=60 independent variables. These independent variables can be in different states. The Monte Carlo simulation, which aims to achieve the accuracy of an exhaustive analysis, is essentially a random sampling of all simulation sets involving these 20 transistors based on possible variations and states, wherein the results of the Monte Carlo simulation will typically follow a normal (i.e. Gaussian) distribution as described below. The Monte Carlo analysis is a well known computation approach and therefore is not discussed in further detail herein. Notably, Monte Carlo analysis can advantageously avoid the pessimism introduced by the current STA solutions that treat each parameter as fully correlated among all transistors.

Note that the synthetic variable Mi is not limited to model the aggregated impact of the $i^{th}$ parameter Vi from all transistors. Indeed, any arbitrary grouping of device mismatch parameters on a subset or all transistors, i.e. mixing different device mismatch parameters across transistors, can formulate a new synthetic variable. For example, the synthetic variables can be grouped by all (or part of) mismatch parameters on p- or n-transistors, or by parameters that exhibit linear or non-linear timing responses.

Figure 7A:
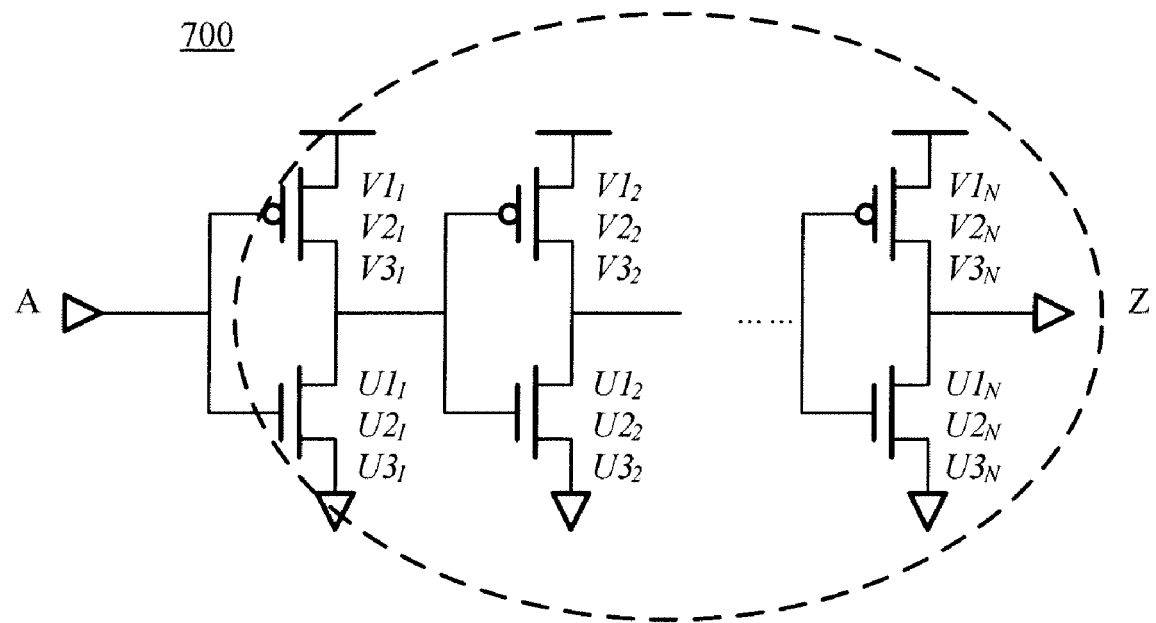
FIG. 7A illustrates an exemplary cell that includes multiple device mismatch parameters that can be combined into a single variable M, wherein delay distribution $D_M$ is a function of M.

Advantageously, to further simplify the mismatch model, the effects of all mismatch parameters (e.g. V1, V2, V3, U1, U2, and U3 of FIG. 1) can be combined as a single synthetic random variable M. For example, FIG. 7A illustrates an exemplary cell 700 that includes multiple parameters that can vary within the cell, but can be combined into a single variable M, wherein delay distribution D is a function of M. This variable M represents the overall mismatch behavior of all parameters in all transistors at the cell-level. Initial investigation showed close results such that it may be accurate enough by just using one parameter to represent the entire transistor-mismatch behavior of a cell.

Figure 7B:
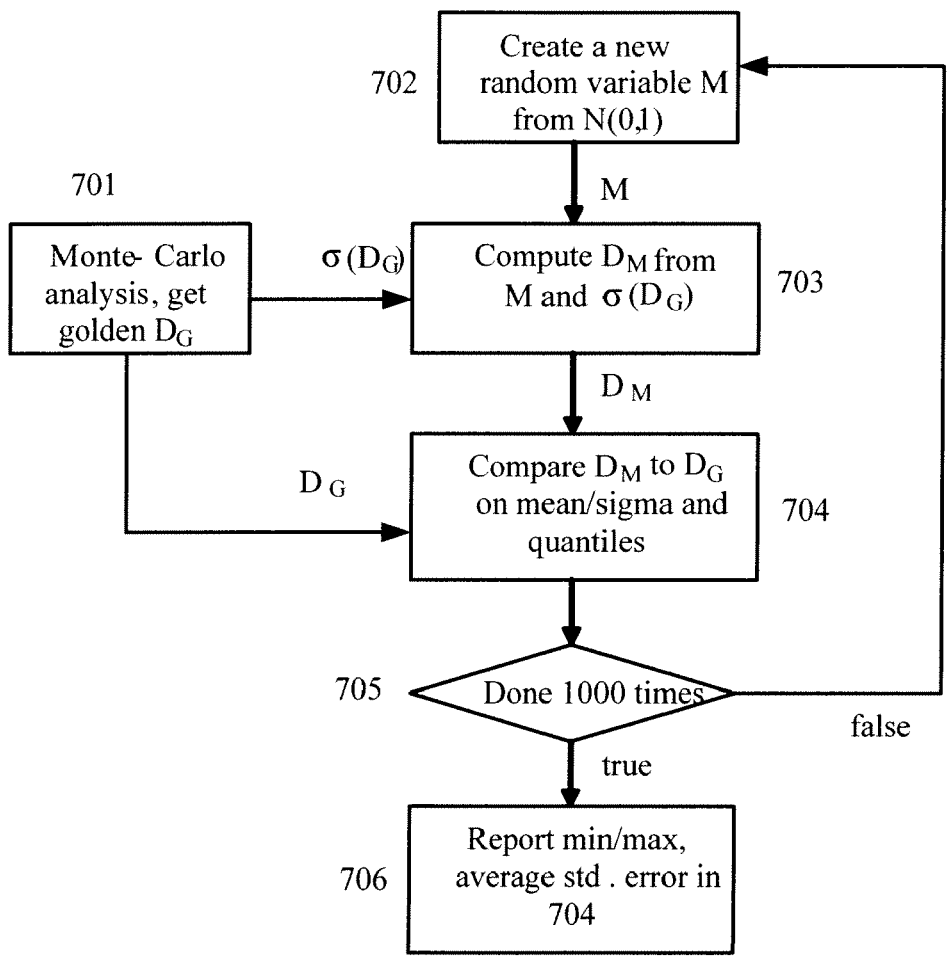
FIG. 7B illustrates a method for empirically confirming the legitimacy of the synthetic variable M.

The legitimacy of synthetic variable M can be confirmed empirically by using the steps shown in FIG. 7B. In step 701, Monte Carlo analysis covering all mismatch parameters on all transistors can be performed, thereby resulting in one random synthetic variable per arc (e.g. a delay variable). This result is referred to as the "golden" result and has a distribution $D_G$ with a mean $\mu$ and a standard deviation $\sigma(D_G)$. In step 702, a synthetic variable M can be created from a standard Gaussian N(0,1) (wherein a synthetic variable can be considered optimized when it is standardized). In step 703, the synthetic variable M can be transformed to a distribution $D_M$ using $\mu$ and $\sigma(D_G)$. In step 704, the mean/sigma and a limited number (e.g. five) quantile values from q01 to q99 of $D_M$ can be computed and then compared with corresponding attributes of $D_G$. After this process is repeated many (e.g. 1000) times with many (e.g. 1000) different samples of the random variables M as determined in step 705, then the minimum/maximum values, the average deviation, and the standard deviation of percentage error on mean/sigma/quantiles of distribution $D_M$ can be reported in step 706 and subsequently compared to the golden results of distribution $D_G$.

Empirical results using data from two foundries are shown in Tables 2A, 2B, 3A, and 3B (Tables 2A and 2B including small cell and large cell data, respectively, for foundry 1; and Tables 3A and 3B including small cell and large cell data, respectively, for foundry 2). In this embodiment, foundry 1 has six mismatch parameters whereas foundry 2 has four mismatch parameters (all mismatch parameters being combined into a single variable).

TABLE 2A

Gaussian estimation error on foundry 1 data: small cell

| attribute | min error % | max error % | average error % | std dev error % |
|---|---|---|---|---|
| mean | −0.73 | 0.47 | −0.001 | 0.16 |
| sigma | −18.67 | 13.82 | −1.73 | 5.09 |
| q01 | −1.78 | 1.15 | −0.38 | 0.66 |
| q05 | −1.31 | 1.08 | −0.04 | 0.36 |
| q50 | −0.85 | 0.63 | 0.05 | 0.20 |
| q95 | −0.88 | 1.13 | −0.03 | 0.32 |
| q99 | −1.53 | 1.25 | −0.12 | 0.50 |

TABLE 2B

Gaussian estimation error on foundry 1 data: large cell

| attribute | min error % | max error % | average error % | std dev error % |
|---|---|---|---|---|
| mean | −0.54 | 0.41 | 0.04 | 0.13 |
| sigma | −18.67 | 13.82 | −1.73 | 5.09 |
| q01 | −1.10 | 1.11 | −0.04 | 0.41 |
| q05 | −1.04 | 0.76 | −0.08 | 0.28 |
| q50 | −0.64 | 0.50 | 0.04 | 0.16 |
| q95 | −0.52 | 1.10 | 0.16 | 0.31 |
| q99 | −1.05 | 1.22 | 0.10 | 0.41 |

TABLE 3A

Gaussian estimation error on foundry 2 data: small cell

| attribute | min error % | max error % | average error % | std dev error % |
|---|---|---|---|---|
| mean | −1.51 | 0.96 | −0.001 | 0.32 |
| sigma | −18.67 | 13.82 | −1.73 | 5.09 |
| q01 | −3.92 | 2.38 | −0.90 | 1.48 |
| q05 | −3.03 | 2.04 | −0.33 | 0.82 |
| q50 | −1.65 | 1.37 | 0.17 | 0.43 |
| q95 | −1.84 | 2.11 | −0.18 | 0.66 |
| q99 | −3.58 | 1.79 | −0.85 | 1.27 |

TABLE 3B

Gaussian estimation error on foundry 2 data: large cell

| attribute | min error % | max error % | average error % | std dev error % |
|---|---|---|---|---|
| mean | −0.50 | 0.32 | −0.001 | 0.11 |
| sigma | −18.67 | 13.82 | −1.73 | 5.09 |
| q01 | −1.10 | 0.87 | −0.16 | 0.40 |
| q05 | −0.84 | 0.77 | 0.02 | 0.24 |
| q50 | −0.60 | −0.41 | 0.01 | 0.13 |
| q95 | −0.62 | 0.76 | −0.04 | 0.23 |
| q99 | −1.03 | 0.89 | −0.05 | 0.34 |

As shown in Tables 2A, 2B, 3A, and 3B, the bound of the error percentage is usually within (−2%, 2%) for most quantile values, although min errors over −3% are seen in the small cells of foundry 2. The standard deviation of error is under 1%, which indicates in most cases that the error is small. The average error is very close to zero, which is also a good indication that the errors from different stages tend to cancel out. The error on mean/q50 is always small, which indicates there should be very limited impact on mean-shift. Note that the relative error on sigma is usually larger than other attributes (and, in this case, is always the same because the 1000 random streams are chosen deterministically). Notably, the error on sigma value showed no direct impact to errors on any quantile points.

Of interest, as shown by empirical data, the large cells exhibit more regular behavior (i.e. the arc delays are more like Gaussian distributions) than the small cells. This data is in contrast to the current STA model that can introduce more pessimism especially in large cells.

Figure 8:
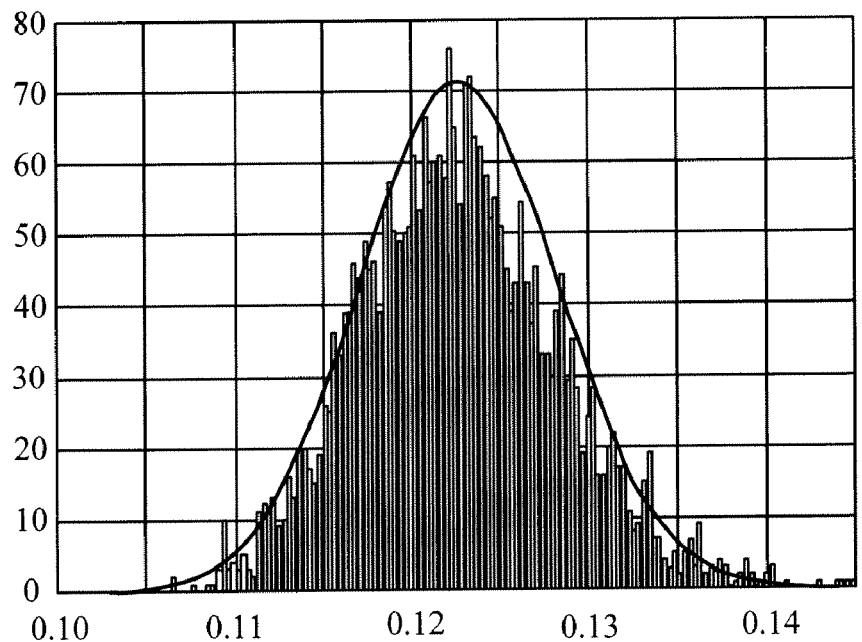
FIG. 8 illustrates a histogram of the Monte Carlo result $D_G$ of small cell delay from a foundry compared to a Gaussian PDF.
Figure 9:
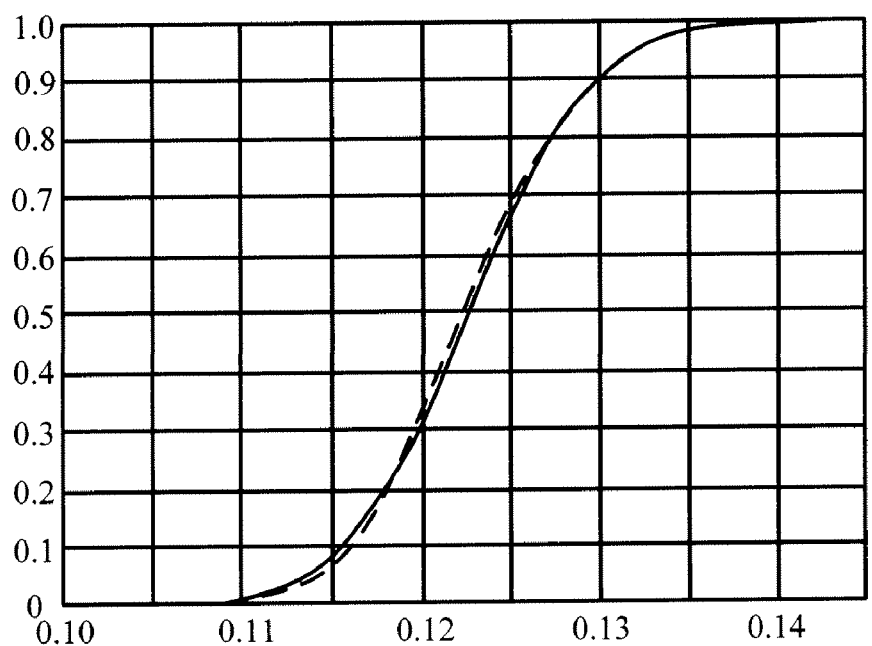
FIG. 9 illustrates CDF curves of the Monte Carlo result $D_G$ of small cell delay from a foundry compared to a Gaussian CDF.

FIG. 8 illustrates a histogram 800 of the Monte Carlo results $D_G$ of small cell delay from foundry 2 (with −4% min error) compared to a Gaussian distribution. FIG. 9 illustrates CDF (a cumulative distribution function that always starts at zero and ends at one) curves 900 of the Monte Carlo result $D_G$ of small cell delay from foundry 2 compared to a Gaussian CDF. As shown in FIGS. 8 and 9, both results closely resemble a Gaussian distribution.

Figure 10:
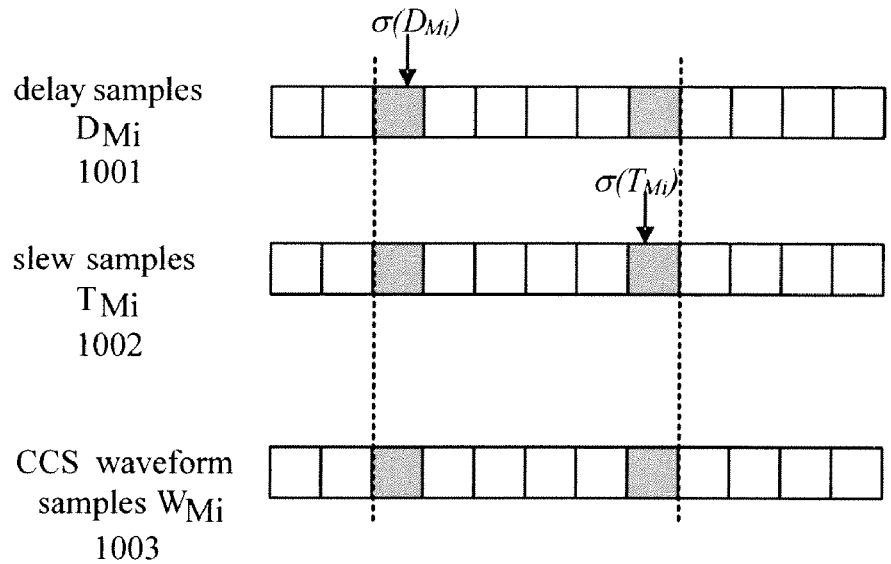
FIG. 10 illustrates that if the Monte Carlo method is applied to delay and slew separately, there can be miscorrelation between delay and slew.

FIG. 10 illustrates that if the above-described Monte Carlo method is applied to delay and slew separately, there can be miscorrelation between delay and slew. For example, assume that Monte Carlo analysis produces the sample distribution of delay and slew as $D_{Mi}$ 1001 and $T_{Mi}$ 1002, respectively. When $\sigma(D_{Mi})$ and $\sigma(T_{Mi})$ are computed and their values are chosen to the closest the sample values from the respective distributions, then the two values will typically not come from the same Monte Carlo run (and in reality, such combination may never exist in device physics). In one embodiment, delay and slew are chosen from the same simulation run by only using $\sigma(D_{Mi})$ or $\sigma(T_{Mi})$ as the selector. In one embodiment, the CCS (composite current source, which is an open current source nanometer modeling technology introduced by Synopsys, Inc. in 2004) waveform $W_{Mi}$ 1003 can be chosen by using either $\sigma(D_{Mi})$ or $\sigma(T_{Mi})$. In another embodiment, the CCS waveform $W_{Mi}$ 1003 can be chosen by weighting both $\sigma(D_{Mi})$ and $\sigma(T_{Mi})$, and then summing those resulting products.

Figure 11:
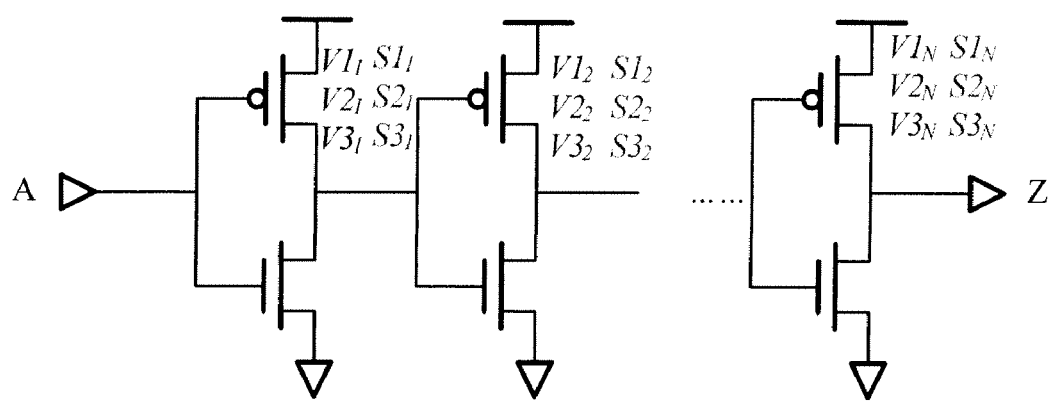
FIG. 11 illustrates a cell in which device mismatch can be mitigated using a synthetic variable derived from independent parameters and sensitivities for each device.

The above-described solution requires Monte Carlo analysis for each arc. To further reduce the characterization load, another embodiment considers the sensitivity of each parameter to the output (e.g. arc delay). For example, referring to FIG. 11, parameter Vi on the $j^{th}$ transistor $Vi_j$ can be assumed to contribute to the arc delay by a factor of $Si_j$, which is the delay sensitivity of Vi on the $j^{th}$ transistor (wherein sensitivity is the rate of change on the output compared to the rate of change on the input, i.e. the first derivative). In a linear delay model for parameter Vi, each variation parameter's contribution to the arc delay can be modeled by a single sensitivity value. Thus, the arc delay (i.e. the random variable representing delay variation on parameter Vi) is the linear sum of the product of each $Vi_j$ and $Si_j$:

$$D_{Mi} = Vi_1 \times Si_1 + Vi_2 \times Si_2 + \ldots + Vi_R \times Si_R \quad (1)$$

where R is the total number of devices.

When all $Vi_j$s are independent standard Gaussian variables (and therefore can be always normalized to N(0,1)), the standard deviation of $D_{Mi}$ can be expressed as:

$$\sigma(D_{Mi}) = (Si_1^2 + Si_2^2 + \ldots + Si_R^2)^{1/2} \quad (2)$$

Note that the sensitivities $Si_j$ can be computed by conducting N deterministic HSPICE analysis with setting $Vi_j = 1$ at a time while all other $Vi_k = 0 \; \forall k \neq j$. (Note that although HSPICE is used in various embodiments disclosed herein, other IC simulation programs can be used to implement the techniques described below. HSPICE is a prominent, commercial version of SPICE that is licensed by Synopsys, Inc.) At this point, $\sigma(D_{Mi})$ can be computed in R HSPICE runs (as opposed to K Monte Carlo runs, in which number of total samples K is usually much larger than the number of transistors R). However, if the sigma values of delay and slew are estimated by equation (2) in separation, delay vs. slew correlation is not preserved, thereby making the derivation of a CCS model for σ point library data difficult.

Therefore, in one embodiment, after obtaining all sensitivity values for both delay and slew, equation (1) can be used to generate the delay distribution $D_{Mi}$ and slew distribution $T_{Mi}$ by doing Monte Carlo sampling on variables $Vi_1, Vi_2, \ldots, Vi_N$. At this point, a specific sample point among all samples of D and $T_{Mi}$ can be selected to represent the closest match to the $\sigma(D_{Mi})$ point for delay and the $\sigma(T_{Mi})$ point for slew. Assuming this sample has deterministic values $(vi_1, vi_2, \ldots, vi_R)$, these values can be used to perform a deterministic HSPICE analysis to derive the σ point library data with correlated delay, slew, and CCS models.

Note that the overall transistor mismatch impact on delay variation can be combined into a single synthetic variable M. In this case, equations (1) and (2) become:

$$D_M = V1_1 \times S1_1 + V1_2 \times S1_2 + \ldots +$$
$$V1_R \times S1_R + V2_1 \times S2_1 + V2_2 \times S2_2 + \ldots +$$
$$V2_R \times S2_R + \ldots + Vn_1 \times Sn_1 + Vn_2 \times Sn_2 + \ldots + Vn_R \times Sn_R$$
$$\sigma(D_M) = (S1_1^2 + S1_2^2 + \ldots +$$
$$S1_R^2 + S2_1^2 + S2_2^2 + \ldots + S2_R^2 + \ldots + Sn_1^2 + Sn_2^2 + \ldots + Sn_R^2)^{1/2}$$

where n is the number of mismatch parameters per device, R is the total number of transistors in a cell. Let N=R×n be the total number of mismatch parameters for all transistors.

Figure 12:
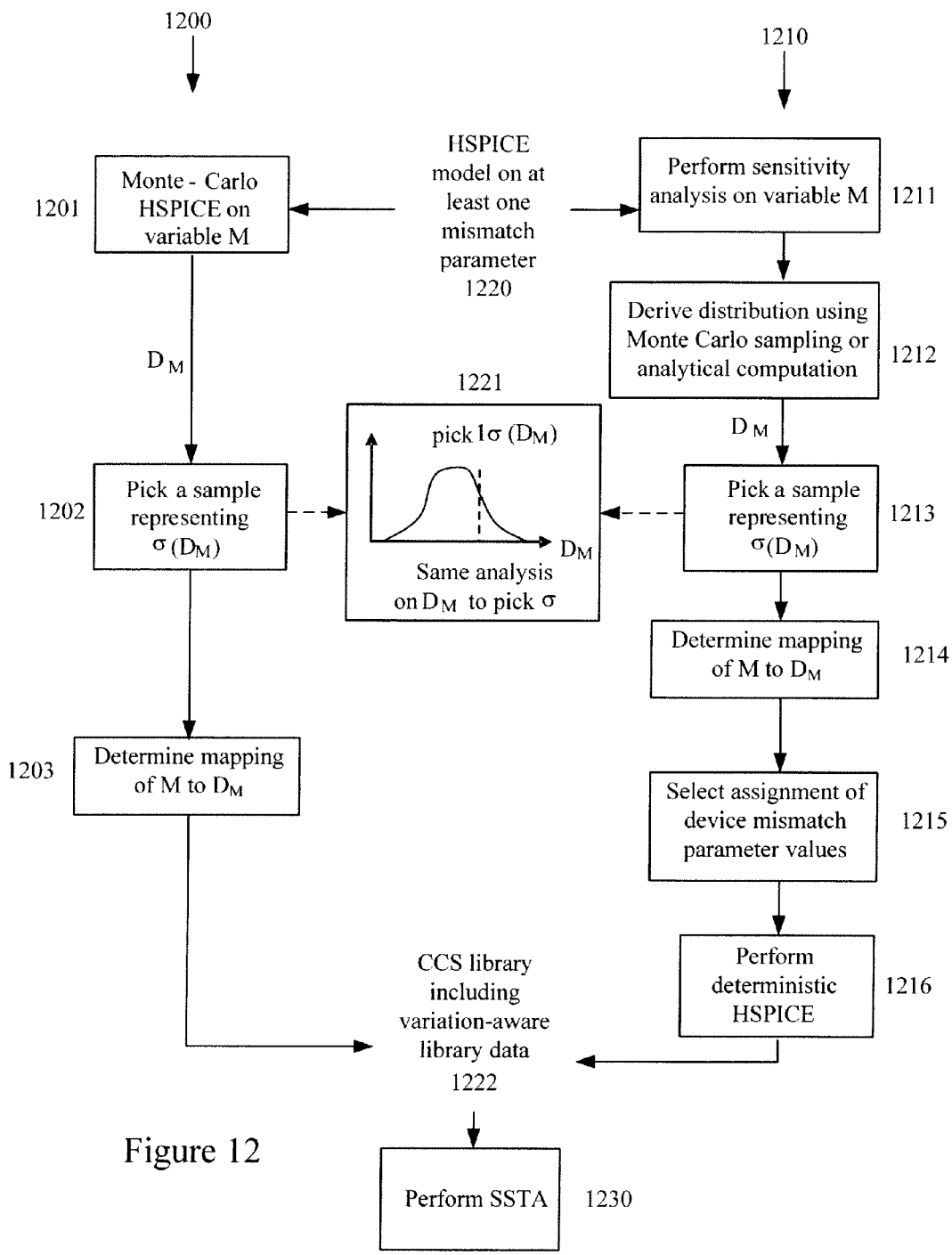
FIG. 12 compares the differences between the Monte Carlo method and the sensitivity method, both of which can generate the synthetic variable M.

FIG. 12 compares the differences between the Monte Carlo method 1200 and the sensitivity method 1210 (only showing delay for brevity, although both delay and slew can be taken into account by the two methods). Both methods receive an input of an HSPICE model (specifically, an HSPICE netlist) on device mismatch 1220. Moreover, both methods derive the mapping between the synthetic variable M and its corresponding delay distribution $D_M$, but by using different techniques. Specifically, Monte Carlo method 1200 computes $D_M$ by full Monte Carlo simulation in step 1201. In contrast, sensitivity method 1210 first computes sensitivity values in step 1211, then derives the distribution $D_M$ and $G(D_M)$ by either Monte Carlo sampling to equation 1, or analytical computation (i.e. applying equation 2 when all mismatch parameters are Gaussian with linear response) in step 1212 (wherein Monte Carlo sampling directly applies random sample values to mismatch parameters, and thus uses significantly less resources than Monte Carlo HSPICE simulations). After the distribution $D_M$ is generated, Monte Carlo method 1200 can select one sample from the Monte Carlo runs in step 1202 (i.e. the closest sample to the 1 sigma of the distribution, as shown in step 1221) and step 1203 can determine a mapping of the synthetic parameter M to the distribution $D_M$ to directly construct the variation-aware library data 1222 with delay and slew.

In contrast, for sensitivity method 1210, after $D_M$ is generated, the sample closest to the 1 sigma of the distribution is selected in step 1213 (as shown in step 1221) (note that weighting can be used when multiple timing properties, e.g. delay and slew, are taken into account and modeled by multiple distributions). Additionally, after $D_M$ is generated, step 1214 can determine a mapping of the synthetic parameter M to the distribution $D_M$, step 1215 can determine an assignment of device mismatch parameter values (from the sample selected from step 1213), and step 1216 can perform deterministic HSPICE analysis to construct the CCS library (which includes variation parameters at their nominal values) including variation-aware library data 1222 from the assignment of device mismatch parameter values from step 1216. At this point, step 1230 can perform statistical STA (SSTA) with the improved CCS library (wherein SSTA forms part of the netlist verification process).

As shown in FIG. 12, both methods 1200 and 1210 can be applied to combine all parameters on all transistors into a single parameter M. Notably, both methods 1200 and 1210 can be applied to any selected subset of device mismatch parameters to create multiple synthetic parameters, or to all parameters on all transistors to create a single parameter M. Note that sensitivity method 1210 can support non-linear models by modifying equation (1) with non-linear (e.g. quadratic or piece-wise linear) terms.

Figure 13:
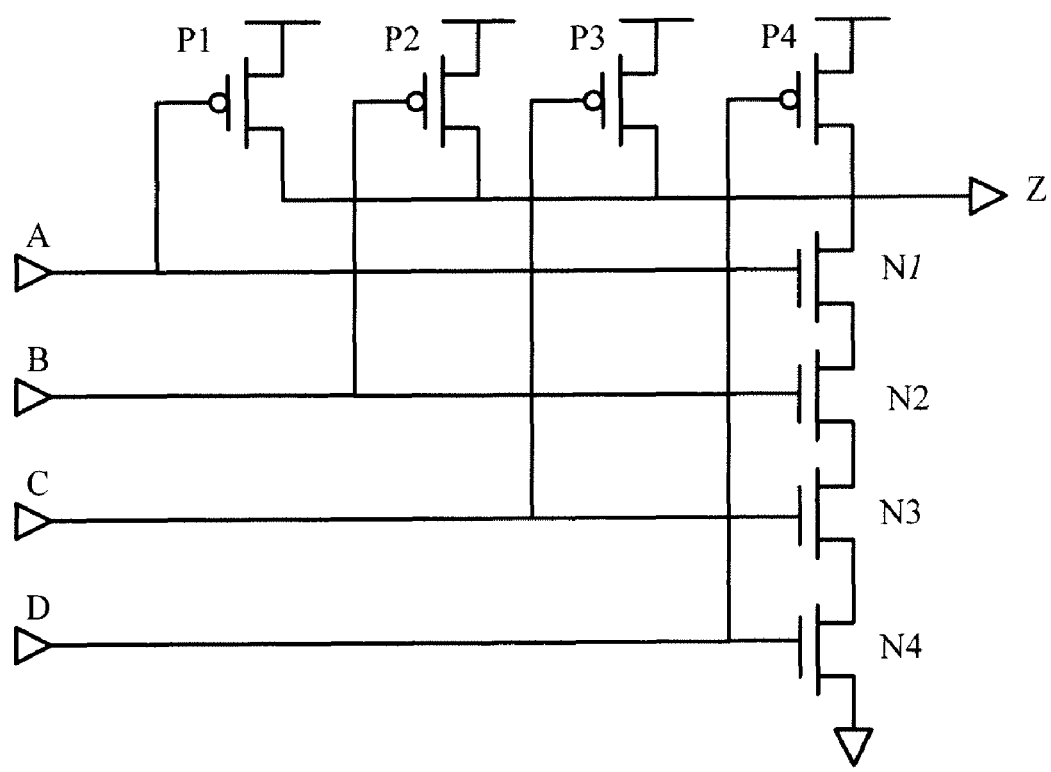
FIG. 13 illustrates a cell in which a plurality of devices can be characterized as inactive, thereby reducing the number of sensitivities that need to be considered.

In terms of characterization effort, Monte Carlo method 1200 typically requires more runtime than sensitivity method 1210. In one embodiment of method 1200, a coarse-grain Monte Carlo analysis can be used as it should take relatively few samples to extract a reasonably accurate sigma value. As discussed above, method 1210 uses N=R×n deterministic HSPICE runs to extract per-transistor sensitivity for each parameter (step 1211), plus one extra run to generate the variation-aware library data (step 1216). In one embodiment, this number N of HSPICE runs can be reduced to only characterize those transistors that are effective in a timing arc. For example, referring to FIG. 13, given a 4-input NAND cell 1300, the arc A->Z only involves transistor P1 and N1 that are switching during the transition). As a result, the sensitivity values of the other transistors in NAND cell 1300 are very close to zero, and they may not have to be characterized for this arc. Therefore, in this example, the characterization time may be reduced by 75% (i.e. the sensitivities of only 2 of the 8 transistors need to be considered).

Note that with Monte Carlo method as well as the sensitivity method, different within-cell topologies may result in different delays and slews. For example, if all transistors in the cell are connected sequentially, then the slew can be determined by the last transistors, but delay is accumulated from all transistors. In this case, the delay vs. slew correlation is weak. In contrast, strong correlation can be found in parallel structures if there is a single transistor that dominates both delay and slew. Therefore, in one embodiment, delay, slew, and CCS waveform can be picked from the same HSPICE run to avoid possible miscorrelation issues.

Optionally, two independent synthetic variables M' and M" can be used to model delay and slew correlation with higher accuracy. M' and M" can be derived from delay distribution $D_M$ and slew distribution $T_M$ using a technique called principle principal component analysis (PCA). Note that PCA is a well-known technique in statistical analysis and therefore is not described in detail herein. Using PCA, M' and M" can be derived as follows:

$$M' = \alpha 1 \times D_M + \beta 1 \times T_M$$

$$M'' = \alpha 2 \times D_M + \beta 2 \times T_M$$

wherein coefficients α1, β1, α2, and β2 are obtained by PCA. The resulting two synthetic variables M' and M" are independent and they correctly reflect the correlation between delay and slew distributions. When delay and slew are strongly correlated, M'' will be close to 0, and the resulting library timing model will be the similar to using a single synthetic parameter M. Note that the PCA method generally applies to the single synthetic parameter M or multiple synthetic parameters.

Monte Carlo method 1200 will now be described in further detail. In one embodiment, the Monte Carlo analysis can be performed by using the HSPICE built-in Monte Carlo support. HSPICE decks (a deck is a file that instantiates circuit simulation models with analysis commands to perform HSPICE simulation) are created for characterizing various types of timing properties. The structure of HSPICE decks for delay and constraint arcs is described herein for illustration purposes. Other characterization types (e.g. input pin capacitances, minimum pulse widths, etc.) are omitted for brevity.

FIG. 14 illustrates delay arc characterizations for an HSPICE deck 1400. As shown in FIG. 14, for a delay arc, a data matrix is swept with transient analysis. The .DATA matrix contains each input slew and output capacitance combination along with other parameter settings for a total of P library data points. The matrix has P lines.

FIG. 15 illustrates constraint arc characterizations for an HSPICE deck 1500. As shown in FIG. 15, for a constraint arc, the transient analysis performs a bisection sweep to find the pass/fail time for setup or hold. Because HSPICE does not allow multiple sweeps in the same transient analysis, different library data points are analyzed by multiple runs invoked by .ALTER commands within each a specific clock slew and data slew combination as defined using a .DATA matrix (which contains a single line). A total of (P−1) .ALTER commands are needed to characterize P library data points.

The HSPICE internal Monte Carlo model can be triggered by "SWEEP MONTE=K" within the transient analysis command. To invoke Monte Carlo analysis, the delay characterization deck can be split to P decks, each deck representing a different library data point. This splitting can be done by breaking the .DATA matrix into P decks, eliminating data sweep in each deck, and then applying a Monte Carlo sweep. The Monte Carlo HSPICE model must be provided with random variable instantiation that can be configured in the setup. FIGS. 16A, 16B, and 16C illustrate exemplary decks for a conversion of a regular delay characterization deck into P Monte Carlo decks for each library data point (i.e. FIG. 16A illustrates an original deck (1600), FIG. 16B illustrates a new deck 1 (1601), and FIG. 16C illustrates a new deck P (1602)).

Each new Monte Carlo HSPICE deck (1–P) will generate K delay and slew distribution samples, from which an appropriate sample index $k_{+1\sigma}$ can be selected to represent the +1σ point of both delay and slew distribution. Let D and T be the delay and slew distribution from Monte Carlo, with sigma values $\sigma_D$ and $\sigma_T$, and K samples $D_1, D_2, \ldots, D_K, T_1, T_2, \ldots T_K$. Each sample's delay and slew differences can be computed from their +1σ values as:

$$\Delta D_k = D_k - (\mu_D + \sigma_D)$$

$$\Delta T_k = T_k - (\mu_T + \sigma_T) \quad (3)$$

The combined difference for both delay and slew is:

$$\Delta DT_k = (\Delta D_k^2 + \Delta T_k^2)^{1/2} \quad (4)$$

The sample index $k_{+1\sigma}$ is selected at an index k at which $\Delta DT_k$ is the minimal among all K samples.

$$k_{+1\sigma} = k:\Delta DT_k = \min\{\Delta DT_i | \forall i \in [1, K]\} \quad (5)$$

Sample $k_{+1\sigma}$ is the closest match to the +1σ point of both delay and slew distributions. Equations (3-5) can be applied to any other points such as ±1σ or ±3σ or arbitrary quantile points.

After the index $k_{+1\sigma}$ is determined, a CCS model can be derived accordingly from the $k_{+1\sigma}^{th}$ Monte Carlo simulation result. Each library data point will require a separate Monte Carlo analysis and result in a potentially different $k_{+1\sigma}$ index.

Note that the same procedure cannot apply to constraint characterization because HSPICE cannot perform bisection sweep (a method to characterize constraint values) and Monte Carlo sweep at the same time.

To overcome the HPSICE limitation on supporting Monte Carlo for constraint characterization, a method to feed HPSICE with random samples that are prepared outside of HPSICE can be developed. The external sampling method works for both delay and constraint characterization, as show in FIGS. 17A, 17B, 17C, 18A, 18B, and 18C.

In FIGS. 17A, 17B, and 17C, an original delay characterization deck 1700 can be first split into P new decks without data sweep (new deck 1 (1701) and new deck P (1702) shown). Then each new deck will perform a sweep on a new data matrix, which contains K external samples and will result in delay and slew distribution D and T with K samples. The same method in equations (3-5) can be applied to analyze delay and slew distribution and derive the sample index $j_{+1\sigma}$.

In FIGS. 18A, 18B, and 18C, an original constraint characterization deck 1800 can be split into P new decks (new deck 1 (1801) and new deck P (1802) shown). Each new deck must keep the bisection sweep. As a result the external sample matrix cannot be swept as FIGS. 17B and 17C do. Instead, K external samples are fed to each deck by (K−1) ALTER blocks. Each new deck will also produce the constraint distribution with K samples.

Let the setup or hold distribution be C. Similar to equations (3-5), the sample index $k_{+1\sigma}$ is derived from a single distribution C as the closest match to the +1σ point of the constraint distribution:

$$\Delta C_k = |C_k - \sigma_C| \quad (6)$$

$$k_{+1\sigma} = k:\Delta C_j = \min\{\Delta C_i | \forall i \in [1, KJ]\} \quad (7)$$

When samples are fed externally, the HSPICE models can be modified to define a unique name for each instance of the same random variable on different transistors. In FIGS. 17B, 17C, 18B, and 18C, the parameter names "par1 par2 . . . parN" should differentiate all mismatch parameters on different transistors.

The runtime of Monte Carlo analysis is proportional to the sample count K. To accurately capture the variation behavior, K is usually at least a few hundreds or even a few thousands, thus making the characterization runtime prohibitive. When K is fixed, there is virtually no opportunity to further reduce runtime.

Sensitivity analysis will now be described in further detail. Sensitivity analysis assumes linear and independent timing response to multiple variables. Let D, T and C be delay, slew and constraint distributions, respectively, and $V_1, V_2, \ldots, V_N$ be N random variables representing all mismatch parameters in all transistors. Therefore, a linear-sensitivity model is based on the assumption:

$$D = D_0 + V_1 \times S_{D1} + V_2 \times S_{D2} + \ldots + V_N \times S_{DN}$$

$$T = T_0 + V_1 \times S_{T1} + V_2 \times S_{T2} + \ldots + V_N \times S_{TN} \quad (8)$$

$$C = C_0 + V_1 \times S_{C1} + V_2 \times S_{C2} + \ldots + V_N \times S_{CN} \quad (9)$$

where $D_0$, $T_0$, $C_0$ are nominal values of delay, slew and constraint, $S_{Di}$, $S_{Ti}$, $S_{Ci}$ are delay, slew and constraint sensitivities for each individual random variable.

In order to obtain sensitivity values, N=R×n HSPICE runs can be performed, where R is the number of transistors and n is the number of random variables per transistor. Each HSPICE run will perturb one parameter at a non-nominal value while all others remain at nominal. The results can be compared to a nominal HSPICE run (that is needed to characterize the nominal library data and must be prepared prior to mismatch characterization), and sensitivities are computed accordingly.

The sensitivity extraction flow is illustrated in FIGS. 19A, 19B, 19C, 20A, 20B, and 20C (which are similar to FIGS. 17A, 17B, 17C, 18A, 18B, and 18C), in which the K×N external sample matrix is replaced by an N×N diagonal matrix that varies only one variable at a time. In FIGS. 19A, 19B, and 19C, an original delay characterization deck 1900 can be split into P new decks (new deck 1 (1901) and new deck P (1902) shown), whereas in FIGS. 20A, 20B, and 20C, an original delay characterization deck 2000 can be split into P new decks (new deck 1 (2001) and new deck P (2002) shown). The same model preparation process is needed prior to characterization.

From sensitivity values of delay, slew, or constraint, equations (8-9) can be fed with external random samples to compute delay, slew, or constraint distributions, and then the +1σ points can be derived accordingly from equations (3-7). This approach combines sensitivity analysis with Monte Carlo sampling to derive distributions and +1σ points.

On the other hand, the standard deviation can be computed analytically by assuming all random variables are standard Gaussian and independent to each other:

$$\sigma_D = (S_{D1}^2 + S_{D2}^2 + \ldots + S_{DN}^2)^{1/2}$$

$$\sigma_T = (S_{T1}^2 + S_{T2}^2 + \ldots + S_{TN}^2)^{1/2} \quad (10)$$

$$\sigma_C = (S_{C1}^2 + S_{C2}^2 + \ldots + S_{CN}^2)^{1/2} \quad (11)$$

Then, a combination of sample values $V_1, V_2, \ldots V_N$, can be found that produces $\sigma_D$, $\sigma_T$, $\sigma_C$. This analytical method can remove the need for Monte Carlo sampling when all random variables are independent standard Gaussians with linear responses for all timing attributers.

Note that in large cells, R can easily get close to one hundred. In this case, the total number of HSPICE runs needed to extract sensitivity can be a few hundreds. As a result, sensitivity analysis can be as expensive as, or even more expensive than a low-resolution Monte Carlo analysis that will give reasonable accuracy with a few hundred samples.

The cost of sensitivity analysis is expected to be N=R×n times slower than the regular deterministic characterization runtime. However, as noted above, not all transistors are involved in a specific timing transition. For those transistors that are not contributing to the timing behavior, their sensitivities are very close to zero. In one embodiment, a first optimization technique can find such transistors with low runtime overhead, and then skip them in sensitivity extraction.

Additionally, note that sensitivity extraction must be repeated at every library data point. When P is the total number of library data points, sensitivity analysis will require R×n×P times of HSPICE analysis. Note that sensitivity analysis requires the nominal library data to be characterized beforehand. Thus, the nominal library data must have already completed P HSPICE runs. If the shape of the sensitivity response of timing attributes can be estimated, then sensitivity extraction at some points can be skipped and the corresponding sensitivity values can interpolated without loosing accuracy. In a second optimization method, P can be reduced in sensitivity extraction.

Figure 21A:
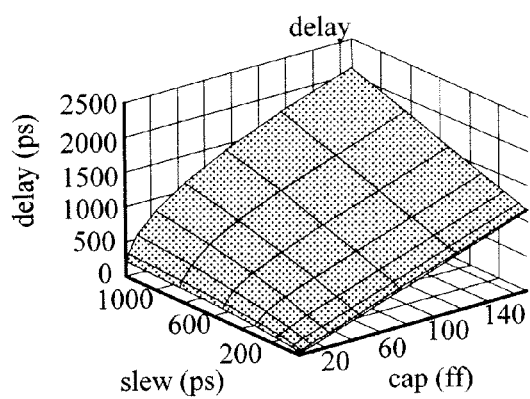
FIG. 21A illustrates the delay surfaces of a timing arc of a transistor.
Figure 21B:
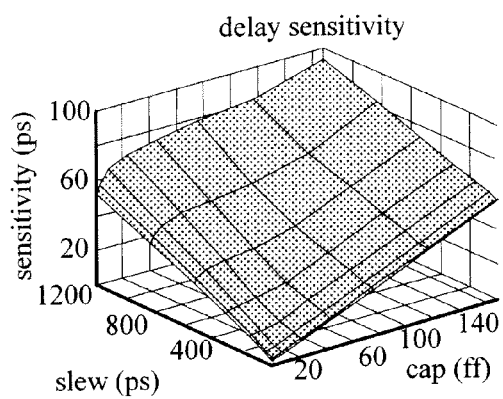
FIGS. 21B, 21C, and 21D illustrate the delay sensitivity surfaces of a transistor in its switching, remaining-on, and remaining-off states, respectively.
Figure 21C:
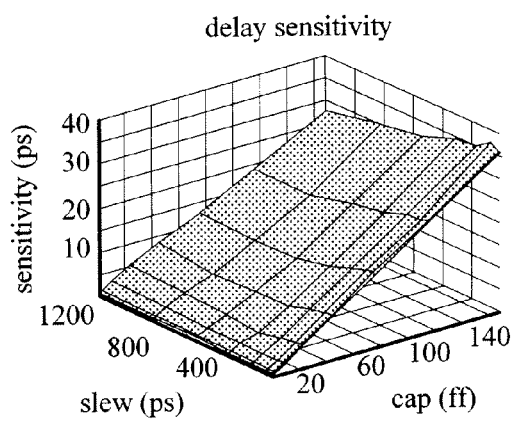
Figure 21D:
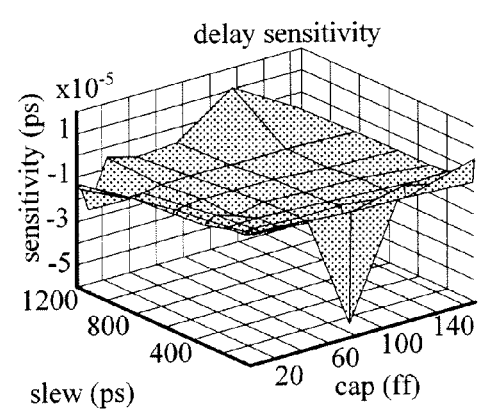

In a CMOS standard cell, when a timing transition occurs, all transistors within the cell fall into three categories: switching, remaining on, and remaining off. As shown below, the switching transistors typically have the greatest impact to the timing behavior, the remaining-on transistors can contribute to second-order effects, and the remaining-off transistors should have negligible impact, if any. For example, referring to 4-input NAND gate 1300 shown in FIG. 13, when a rise transition at input A occurs (other inputs are sensitized as B=C=D=1), transistors P1/N1 will be switching, N2/N3/N4 will remain on, and P2/P3/P4 will remain off. FIG. 21A illustrates the delay surfaces of a timing arc; FIG. 21B illustrates the sensitivity surfaces of a random variable on a switching transistor; FIG. 21C illustrates the sensitivity surfaces of a remaining-on transistor; and FIG. 21D illustrates the sensitivity surfaces of a remaining-off transistor. Notably, the vertical scale in FIGS. 21B and 21C shows drastic differences in sensitivity values, whereas the impact of the off transistor as shown by the vertical scale in FIG. 21D is virtually non-existing (as the sensitivity scale is in the order of $10^{-6}$).

Based on this observation, if non-critical (i.e. usually remaining-off) transistors can be identified, all random variables on such transistors can be assigned to zero without running HSPICE to extract sensitivity values, which are very close to zero.

Note that when R×n×P HSPICE sensitivity extractions are run to determine which transistors have all zero-sensitivity parameters, there is no opportunity for runtime reduction. Fortunately, when the timing behavior is expressed at P table points, where each point represents a combination of input/output slew or capacitance values, whether a transistor remains off during the timing transition should be consistent across all table points. As a result, only a subset of all P points can be analyzed to answer this question.

Figure 22:
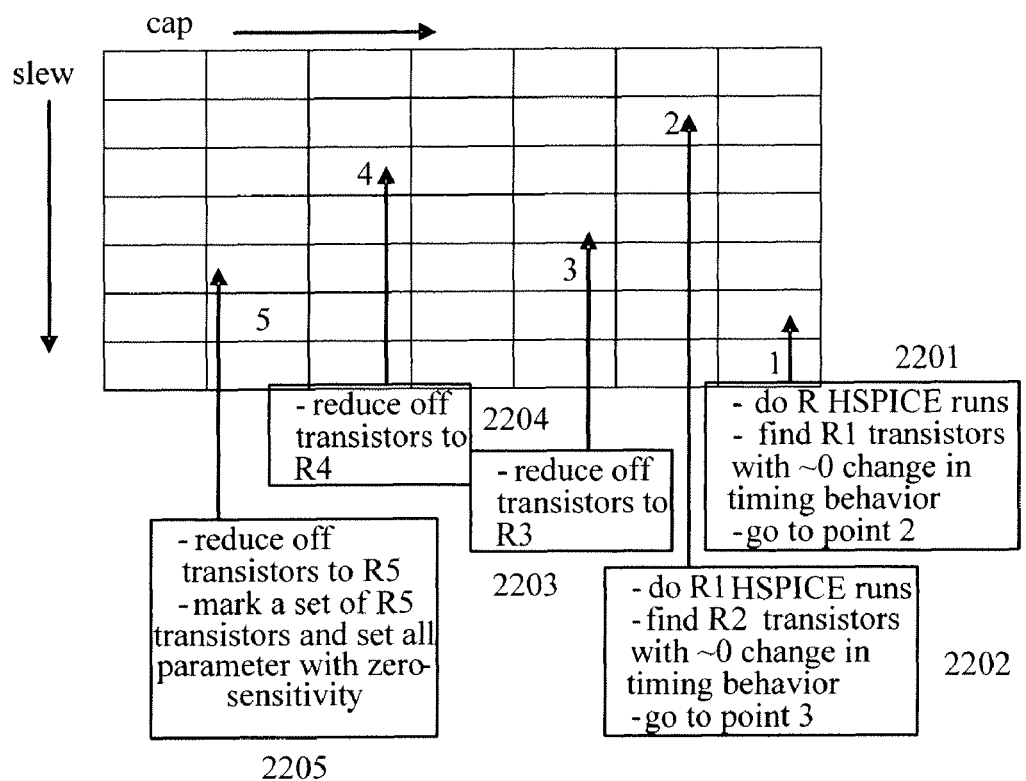
FIG. 22 illustrates the use of 5 points in a 2-D library table space to reduce the number of transistors in sensitivity extraction.

One solution is to evaluate a few (e.g. five) points in a two-dimensional library table space, illustrated in FIG. 22. In one embodiment, the first row or column can be avoided because small slew or small load (wherein load is expressed as capacitance) is not very common in real designs. Therefore, any potential errors can be tolerated at these points. Note that library tables for delay timing arcs are typically based on input slew and output load. In contrast, library tables for constraint arcs are typically based on clock slew and data slew.

The sensitivity on these five points can be extracted by R×n×5 HSPICE runs. These sensitivities can be further optimized by combining n runs for n parameters per transistor into a single run, e.g. by setting all n variables to the same value at +1σ. Then, the timing outcome can be compared with the nominal value to determine whether the corresponding transistor is off at one of the five points. For example, referring to FIG. 22, step 2201 can perform R HSPICE runs at a first point 1 (wherein each point (i.e. entry in the table) includes a corresponding set of values for slew and capacitance). If a transistor has non-trivial impact at the first point 1 (e.g. by comparing the values of an entry in this table to the values of the corresponding entry in a nominal table), then that transistor must be characterized at all table points and it will be removed from being evaluated at the next point. Thus, step 2201 finds R1 transistors (wherein R1 is a subset of R) with substantially zero change in their timing behavior and then proceeds to a second point 2. Step 2202 can perform R1 HSPICE runs to find R2 transistors (R2 being a subset of R1) with substantially zero change in their timing behavior and then proceeds to a third point 3. Steps 2203 and 2204 perform similar functions as the previous steps and effectively reduce the off transistors to R3 (R3 being a subset of R2) and R4 (R4 being a subset of R3), respectively. Step 2205 reduces the off transistors to R5 and then can mark a set of R5 transistors (R5 being a subset of R4) and set all parameters with zero sensitivity. Note that in general, performing the simulation runs at the first point can typically find 50%-60% transistors that cannot be ignored. As shown in FIG. 22, transistors that cannot be ignored will be removed from being evaluated at all remaining points.

Using the 5-point method, the expected number of HSPICE runs usually ranges from 2×R to 3×R, and approximately 30%-40% of transistors can be safely removed from sensitivity extraction. This means a 3×R additional runtime can result in 30%-40% runtime reduction to R×n×P HSPICE runs in sensitivity extraction. Usually n=2~4 and P=30~60. As a result, the runtime reduction is quite considerable.

Note that although 5 points are used in this embodiment, other embodiments can use another number of points, e.g. 3-7 points. In one preferred embodiment, the points can be chosen to be representative of more realistic slew/capacitance values. In one embodiment, the indices of slew and capacitance are logarithmic. Therefore, the first column and the first row of this table can be ignored for point selection because most arcs would not have these small slew/capacitance values.

In one embodiment, the HSPICE netlist of each cell can be treated as a block box. In this case, HSPICE can be run to analyze the logic. This procedure can be further optimized by analyzing the netlist topology and the logic function of the cell/arc or performing HSPICE DC analysis.

As described below in further detail, the O(R×n×P) sensitivity extraction runtime can be optimized by reducing number of transistors R. Moreover, in one embodiment, the number of library data points P can also be reduced.

Figure 23A:
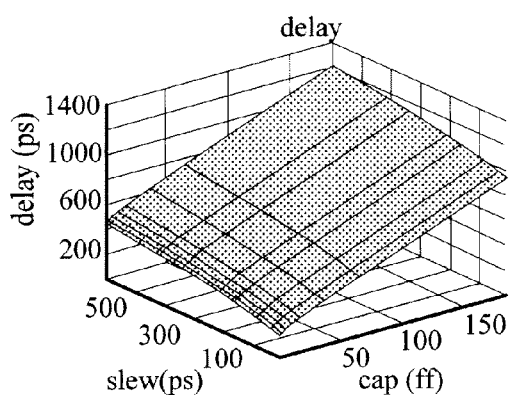
FIGS. 23A, 23B, 23C, and 23D illustrate response surfaces of delay, delay sensitivity, constraint, and constraint sensitivity, respectively, in a D-flip-flop cell.
Figure 23B:
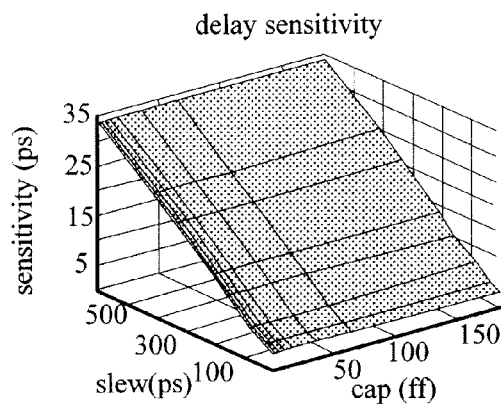
Figure 23C:
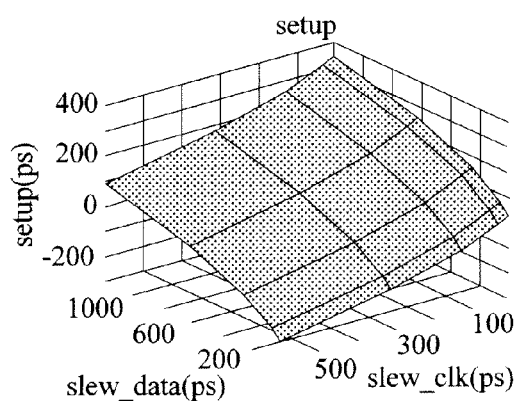
Figure 23D:
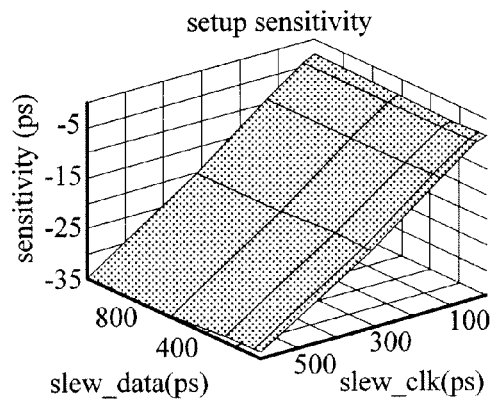

Note that timing behaviors such as delay, slew, or constraint usually exhibit non-linear responses in library data tables (either single-dimensional or two-dimensional). However, notably, the sensitivity responses usually exhibit higher linearity. One possible explanation for this linearity may be that a sensitivity surface is the difference between two delay surfaces in response to a process variable changing from nominal to another value. The two delay surfaces are expected to be close and they are strongly correlated at all P points. As a result, their difference can be represented by a linear surface. For example, FIGS. 23A, 23B, 23C, and 23D illustrate response surfaces of delay, delay sensitivity, constraint, and constraint sensitivity, respectively, in a D-flip-flop cell. Note that the sensitivity surfaces shown in FIGS. 23B and 23D are much more linear than the delay and constraint responses shown in FIGS. 23A and 23C.

Figure 24:
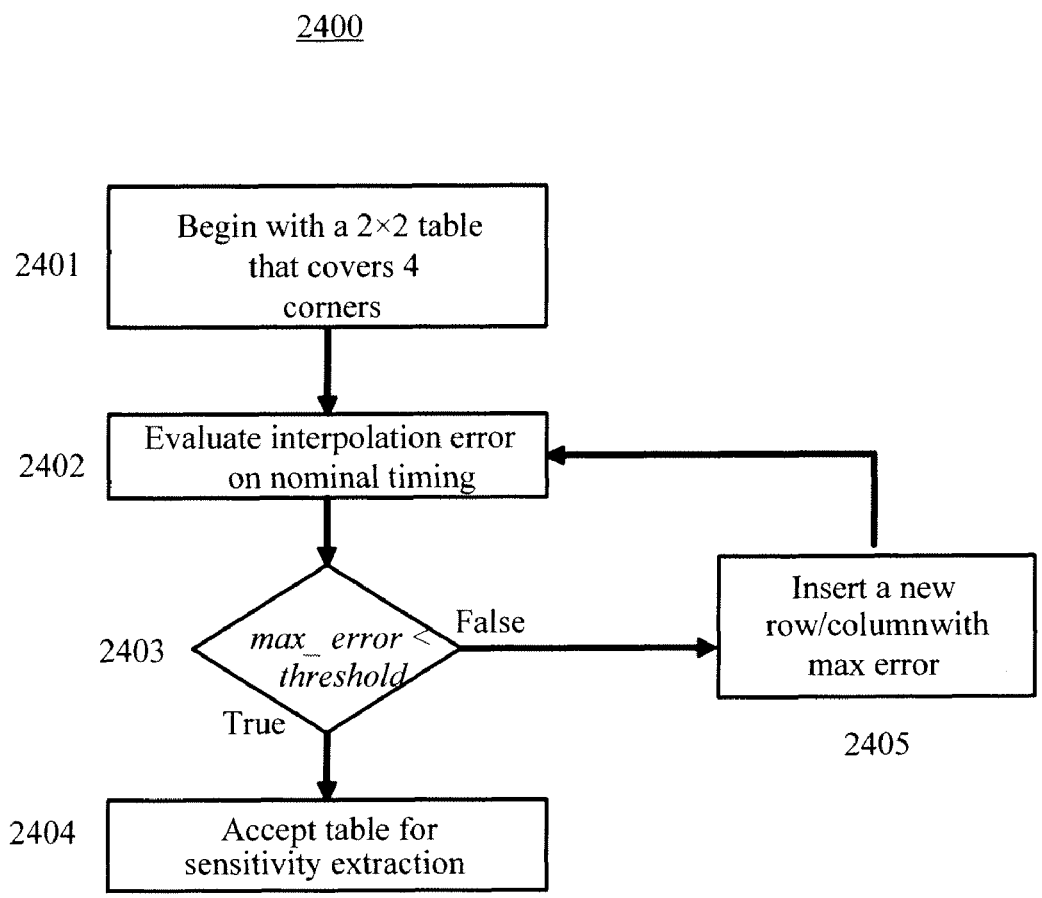
FIG. 24 illustrates an exemplary method for reducing the number of table points in sensitivity extraction.

In one embodiment, an empirical method can be developed to reduce the table points for sensitivity extraction based on the linearity of nominal timing responses. FIG. 24 illustrates an exemplary method 2400 for reducing the number of table points in sensitivity extraction. In step 2401, a 2×2 table that covers both minimum/maximum points on two input dimensions for sensitivity extraction can be generated. Step 2402 can evaluate the interpolation error on nominal timing. Step 2403 can determine whether additional table rows/columns are needed by comparing the full nominal timing table characterized by HSPICE with a full nominal timing table interpolated from the 2×2 table. If at some table points the error exceeds a threshold value, then a row or a column that exhibits the largest interpolation error can be selected and a new row or a new column can be added to the table accordingly in step 2405. Steps 2402, 2403, and 2405 can be repeated until the interpolation errors are under the threshold and the table is accepted for sensitivity extraction in step 2404.

Method 2400 adaptively reduces the table points for sensitivity extraction according to the nominal timing behavior. The additional runtime to determine the final table size is negligible. The resulting reduced table size can be 2×4, 3×4, 3×5, etc. Overall, a 2× to 3×speedup can be achieved compared to using the full table size with typical sizes of 5×5 or 7×7. In one embodiment, 20 ps or 10% can be used as the threshold value in step 2403. This threshold can be further relaxed to achieve more aggressive table size reduction. A further optimization would be using fixed table points (e.g. 3-7 points that cover corners and the middle of the library table space) to maximally reduce sensitivity extraction runtime.

Figure 25:
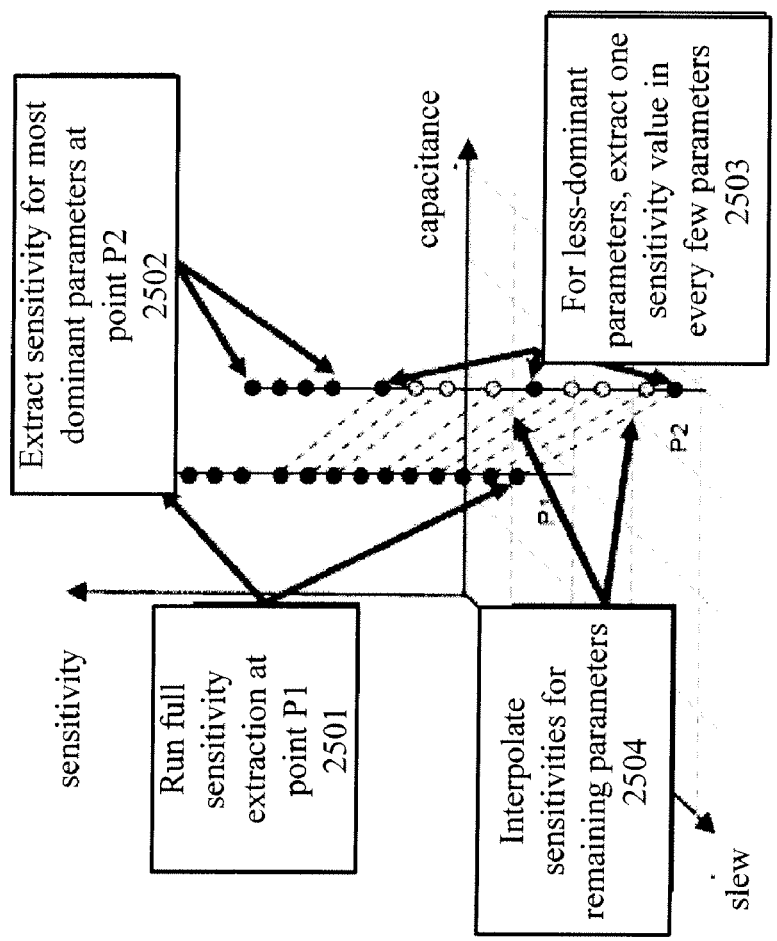
FIG. 25 illustrates a technique for minimizing runtime by extracting limited sensitivity values during the sensitivity analysis.

In one embodiment, runtime can be minimized by extracting limited sensitivity values during the sensitivity analysis. FIG. 25 illustrates an exemplary library table space based on input slew and output capacitance. In step 2501, full sensitivity extraction can be run at a first point P1 in the library table space to determine dominant parameters. In step 2502, sensitivity values can be extracted for the most dominant parameters at a second point P2 in the two-dimensional library table space. In step 2503, sensitivity values can be extracted for selected, less-dominant parameters at point P2 (e.g. every few parameters). In step 2504, sensitivity values can be interpolated for any remaining, less-dominant parameters at point P2 using the sensitivity values for the selected, less-dominant parameters at point P2 and the full sensitivity extraction at point P1. Notably, minimizing full sensitivity extraction to be performed at only one point can advantageously reduce runtime.

After sensitivity values for all mismatch parameters at all table points are determined (including inactive parameters that are assigned zero sensitivities as well as parameters whose sensitivities are extracted by either HSPICE analysis or interpolation), the distributions of timing attributes are obtained by evaluating equations (8-9) using random samples for all mismatch parameters. Then, a similar procedure being used in the Monte Carlo method (equations (3-7)) can be performed to find a sample that closest matches the $+1\sigma$ point of the timing distributions. This sample represents an assignment to all mismatch parameters, which is then fed to a deterministic HSPICE analysis to create the final variation library model.

Figure 26:
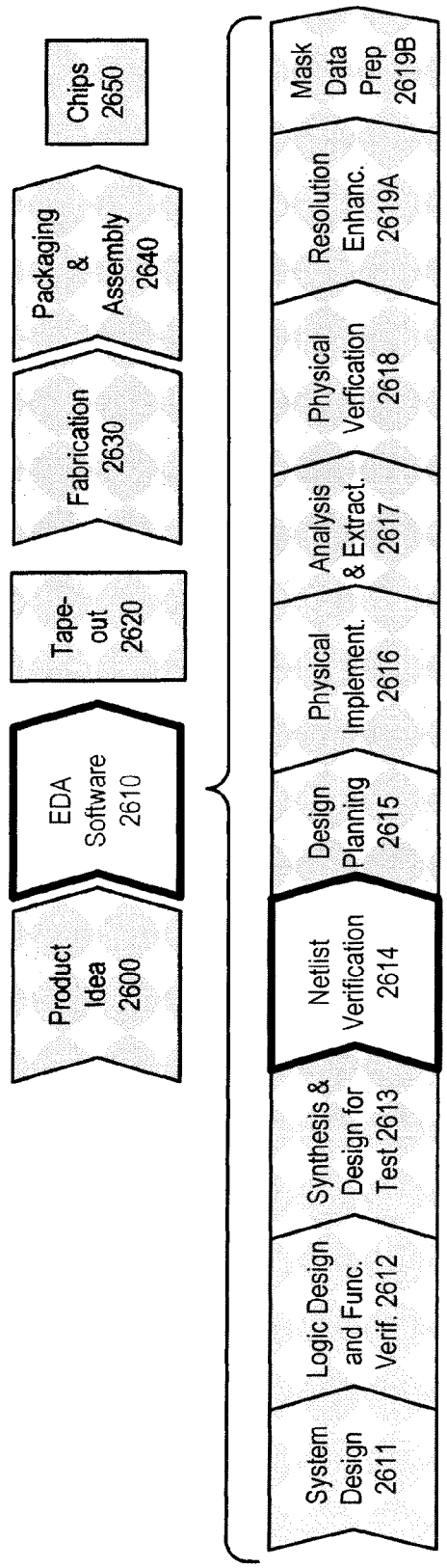
FIG. 26 shows a simplified representation of an exemplary digital ASIC design flow.

A few mismatch characterization embodiments with runtime vs. accuracy tradeoffs are evaluated with several 65 nm and 45 nm library models from different foundries. The characterization methods include a Monte Carlo method using 500 samples, a full sensitivity extraction method for all transistors and parameters at all table points, and the optimized sensitivity extraction method by reducing transistor counts and table points. The Monte Carlo method for each mismatch library characterization takes roughly 500× runtime vs. the deterministic characterization runtime for the nominal library. The mismatch characterization runtime becomes 60× with the full sensitivity extraction method, and is further reduced to 10× with the optimized sensitivity extraction method. All three methods give very similar results across different libraries, and there is no visible accuracy degradation introduced by the optimized sensitivity extraction method. To clarify the implementation of the above-described variation-aware library data that mitigate intra-die random device variations, FIG. 26 shows a simplified representation of an exemplary digital ASIC design flow. At a high level, the process starts with the product idea (step 2600) and is realized in an EDA software design process (step 2610). When the design is finalized, it can be taped-out (event 2620). After tape out, the fabrication process (step 2630) and packaging and assembly processes (step 2640) occur resulting, ultimately, in finished chips (result 2650).

The EDA software design process (step 2610) is actually composed of a number of steps 2611-2619B, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 2610) will now be provided:

System design (step 2611): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 2612): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 2613): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

Netlist verification (step 2614): At this step, the netlist is checked for compliance with timing constraints and for correspondence with the VHDL/Verilog source code. Exemplary EDA software products from Synopsys, Inc. that can be used at this step include Formality, PrimeTime, and VCS products. In one embodiment, the above-described generating of variation-aware libraries that mitigate for intra-die random variations can be implemented during statistical static timing analysis, which is included in netlist verification.

Design planning (step 2615): Here, an overall floorplan for the chip is constructed and analyzed for timing and top-level routing. Exemplary EDA software products from Synopsys, Inc. that can be used at this step include Astro and IC Compiler products.

Physical implementation (step 2616): The placement (positioning of circuit elements) and routing (connection of the same) occurs at this step. Exemplary EDA software products from Synopsys, Inc. that can be used at this step include the Astro and IC Compiler products.

Analysis and extraction (step 2617): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 2618): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 2619A): This step involves geometric manipulations of the layout to improve manufacturability of the design. Exemplary EDA software products from Synopsys, Inc. that can be used at this step include Proteus, ProteusAF, and PSMGen products.

Mask data preparation (step 2619B): This step provides the "tape-out" data for production of masks for lithographic use to produce finished chips. Exemplary EDA software products from Synopsys, Inc. that can be used at this step include the CATS® family of products.

The modeling and characterization of device variation can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

The invention claimed is:

1. A method of generating variation-aware library data, the method comprising:
  receiving a circuit simulation model on at least one device mismatch parameter;
  performing a sensitivity analysis on all device mismatch parameters, the sensitivity analysis including computing a rate of change of a timing property compared to a rate of change of a device mismatch parameter;
  deriving a distribution of each timing property using the sensitivity analysis;
  determining a mapping of one or more synthetic parameters to the distribution, each synthetic parameter being a random variable representing an impact on a timing parameter of all device mismatch parameters grouped to the synthetic parameter;
  selecting an assignment of device mismatch parameter values; and performing a deterministic circuit simulation using the assignment of device mismatch parameter values to generate the variation-aware library data corresponding to a 1 sigma of the synthetic parameter.

2. The method of claim 1, wherein the circuit simulation model is a commercial SPICE model.

3. The method of claim 1, wherein at least one device mismatch parameter is a threshold voltage or a gate length.

4. The method of claim 1, wherein performing the sensitivity analysis includes computing a rate of change of the timing property compared to a rate of change of a device mismatch parameter.

5. The method of claim 4, wherein sensitivity values generated by the sensitivity analysis are expressed in one of linear terms and non-linear terms.

6. The method of claim 1, wherein deriving the distribution of each timing property using the sensitivity analysis includes:
performing a Monte Carlo sampling for all device mismatch parameters; and
computing each sample value of the distribution by performing a linear sum of a product of each sample value of $Vi_j$ and $Si_j$,
wherein $Vi_j$ is a specific device parameter and $Si_j$ is a sensitivity value of the specific device parameter.

7. The method of claim 6, wherein deriving the distribution of each timing property using the sensitivity analysis includes computing the 1 sigma from the distribution.

8. The method of claim 6, wherein deriving the distribution of each timing property using the sensitivity analysis includes computing the 1 sigma, wherein computing the 1 sigma includes squaring each sensitivity, summing the squared sensitivities, and taking a square root of the sum, when all device mismatch parameter are independent Gaussians with linear timing responses.

9. The method of claim 1, wherein performing the sensitivity analysis includes characterizing only active devices.

10. The method of claim 9, wherein characterizing only active devices includes evaluating a predetermined number of points in a two-dimensional library table space to determine the active devices.

11. The method of claim 10, wherein the predetermined number of points is 3-7.

12. The method of claim 1, wherein performing the sensitivity analysis includes reducing library table points for sensitivity extraction based on nominal timing responses or using predetermined library table points.

13. The method of claim 12, wherein a predetermined number of points is 3-7.

14. The method of claim 1, wherein performing the sensitivity analysis includes:
running full sensitivity extraction at a first point in a two-dimensional library table space to determine dominant parameters;
extracting sensitivity values for most dominant parameters at a second point in the two-dimensional library table space;
extracting sensitivity values for selected, less-dominant parameters at the second point; and
interpolating sensitivity values for any remaining, less-dominant parameters at the second point using the sensitivity values for the selected, less-dominant parameters at the second point and the full sensitivity extraction at the first point.

15. The method of claim 14, wherein the two-dimensional library table space is based on input slew and output load.

16. The method of claim 14, wherein the two-dimensional library table space is based on clock slew and data slew.

17. The method of claim 1, wherein determining a mapping of a synthetic parameter to the distribution includes replacing arbitrary quantile values that correspond to the synthetic parameter when the distribution is not Gaussian.

18. The method of claim 1, wherein multiple synthetic parameters can be determined by at least one of an arbitrary grouping of device mismatch parameters, and performing principal component analysis to distributions of timing attributes.

19. A non-transient, computer-readable medium storing computer-executable instructions for generating variation-aware library data, which when executed by a computer performs steps of:
receiving a circuit simulation model on at least one device mismatch parameter;
performing a sensitivity analysis on all device mismatch parameters, the sensitivity analysis including computing a rate of change of a timing property compared to a rate of change of a device mismatch parameter;
deriving a distribution of each timing property using the sensitivity analysis;
determining a mapping of one or more synthetic parameters to the distribution, each synthetic parameter being a random variable representing an impact on a timing parameter of all device mismatch parameters grouped to the synthetic parameter;
selecting an assignment of device mismatch parameter values; and
performing a deterministic circuit simulation using the assignment of device mismatch parameter values to generate the variation-aware library data corresponding to a 1 sigma of the synthetic parameter.

20. The computer-readable medium of claim 19, wherein the circuit simulation model is a commercial SPICE model.

21. The computer-readable medium of claim 19, wherein at least one device mismatch parameter is a threshold voltage or a gate length.

22. The computer-readable medium of claim 19, wherein performing the sensitivity analysis includes computing a rate of change of the timing property compared to a rate of change of a device mismatch parameter.

23. The computer-readable medium of claim 22, wherein sensitivity values generated by the sensitivity analysis are expressed in one of linear terms and non-linear terms.

24. The computer-readable medium of claim 19, wherein deriving the distribution of each timing property using the sensitivity analysis includes:
performing a Monte Carlo sampling for all device mismatch parameters; and
computing each sample value of the distribution by performing a linear sum of a product of each sample value of $Vi_j$ and $Si_j$,
wherein $Vi_j$ is a specific device parameter and $Si_j$ is a sensitivity value of the specific device parameter.

25. The computer-readable medium of claim 24, wherein deriving the distribution of each timing property using the sensitivity analysis includes computing the 1 sigma from the distribution.

26. The computer-readable medium of claim 24, wherein deriving the distribution of each timing property using the sensitivity analysis includes computing the 1 sigma, wherein computing the 1 sigma includes squaring each sensitivity, summing the squared sensitivities, and taking a square root of the sum, when all device mismatch parameter are independent Gaussians with linear timing responses.

27. The computer-readable medium of claim 19, wherein performing the sensitivity analysis includes characterizing only active devices.

28. The computer-readable medium of claim 27, wherein characterizing only active devices includes evaluating a predetermined number of points in a two-dimensional library table space to determine the active devices.

29. The computer-readable medium of claim 28, wherein the predetermined number of points is 3-7.

30. The computer-readable medium of claim 19, wherein performing the sensitivity analysis includes reducing library table points for sensitivity extraction based on nominal timing responses or using predetermined library table points.

31. The computer-readable medium of claim 30, wherein a predetermined number of points is 3-7.

32. The computer-readable medium of claim 19, wherein performing the sensitivity analysis includes:
   running full sensitivity extraction at a first point in a two-dimensional library table space to determine dominant parameters;
   extracting sensitivity values for most dominant parameters at a second point in the two-dimensional library table space;
   extracting sensitivity values for selected, less-dominant parameters at the second point; and
   interpolating sensitivity values for any remaining, less-dominant parameters at the second point using the sensitivity values for the selected, less-dominant parameters at the second point and the full sensitivity extraction at the first point.

33. The computer-readable medium of claim 32, wherein the two-dimensional library table space is based on input slew and output load.

34. The computer-readable medium of claim 32, wherein the two-dimensional library table space is based on clock slew and data slew.

35. The computer-readable medium of claim 19, wherein determining a mapping of a synthetic parameter to the distribution includes replacing arbitrary quantile values that correspond to the synthetic parameter when the distribution is not Gaussian.

36. The computer-readable medium of claim 19, wherein multiple synthetic parameters can be determined by at least one of an arbitrary grouping of device mismatch parameters, and performing principal component analysis to distributions of timing attributes.

* * * * *

UNITED STATES PATENT AND TRADEMARK OFFICE
CERTIFICATE OF CORRECTION

Page 1 of 2

PATENT NO.         : 8,204,730 B2
APPLICATION NO.    : 12/135033
DATED              : June 19, 2012
INVENTOR(S)        : Jinfeng Liu et al.

It is certified that error appears in the above-identified patent and that said Letters Patent is hereby corrected as shown below:

In the Claims

Column 19
Line 7, insert --the-- before "at".
Line 9, insert --the-- before "performing".
Line 17, insert --the-- before "deriving".
Line 27, insert --the-- before "deriving".
Line 30, insert --the-- before "deriving".
Line 32, insert --the-- before "computing".
Line 35, amend "parameter" to --parameters--.
Line 37, insert --the-- before "performing".
Line 39, insert --the-- before "characterizing".
Line 45, insert --the-- before "performing".
Line 51, insert --the-- before "performing".

Column 20
Line 3, insert --the-- before "determining".
Line 3, insert --the-- before "mapping".
Line 37, insert --the-- before "at".
Line 48, insert --the-- before "deriving".
Line 58, insert --the-- before "deriving".
Line 62, insert --the-- before "deriving".
Line 64, insert --the-- before "computing".
Line 66, amend "parameter" to --parameters--.

Column 21
Line 2, insert --the-- before "performing".
Line 5, insert --the-- before "characterizing".
Line 10, insert --the-- before "performing".

Signed and Sealed this
Twentieth Day of May, 2014

Michelle K. Lee
*Deputy Director of the United States Patent and Trademark Office*

CERTIFICATE OF CORRECTION (continued)
U.S. Pat. No. 8,204,730 B2

Line 16, insert --the-- before "performing".

Column 22
Line 13, insert --the-- before "determining".
Line 13, insert --the-- before "mapping".